(12) United States Patent
Zia et al.

(10) Patent No.: US 10,289,935 B2
(45) Date of Patent: May 14, 2019

(54) ADVANCED DRIVER-ASSISTANCE SYSTEM WITH LANDMARK LOCALIZATION ON OBJECTS IN IMAGES USING CONVOLUTIONAL NEURAL NETWORKS

(71) Applicant: NEC Laboratories America, Inc., Princeton, NJ (US)

(72) Inventors: Muhammad Zeeshan Zia, San Jose, CA (US); Quoc-Huy Tran, Santa Clara, CA (US); Xiang Yu, Mountain View, CA (US); Manmohan Chandraker, Santa Clara, CA (US); Chi Li, San Jose, CA (US)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 15/709,814

(22) Filed: Sep. 20, 2017

(65) Prior Publication Data
US 2018/0130355 A1    May 10, 2018

Related U.S. Application Data

(60) Provisional application No. 62/418,894, filed on Nov. 8, 2016.

(51) Int. Cl.
*G05D 1/02* (2006.01)
*G06K 9/00* (2006.01)
(Continued)

(52) U.S. Cl.
CPC ........... *G06K 9/6256* (2013.01); *B60W 30/00* (2013.01); *G05D 1/0221* (2013.01);
(Continued)

(58) Field of Classification Search
CPC ........... G06T 7/74; G06T 15/10; G06T 15/40; B60W 30/00; G05D 1/0221;
(Continued)

(56) References Cited

U.S. PATENT DOCUMENTS

2016/0103213 A1    4/2016 Ikram et al.

OTHER PUBLICATIONS

Lee et al., "Deeply-Supervised Nets", Appearing in Proceedings of the 18th International Conference on Artificial Intelligence and Statistics (AISTATS), May 2015, pp. 562-570.
(Continued)

*Primary Examiner* — Maceeh Anwari
(74) *Attorney, Agent, or Firm* — Joseph Kolodka

(57) ABSTRACT

A system and method are provided for driving assistance. The system includes an image capture device configured to capture an actual image relative to an outward view from a motor vehicle and depicting an object. The system further includes a processor configured to render, based on a set of 3D CAD models, synthetic images with corresponding intermediate shape concept labels. The processor is further configured to form a multi-layer CNN which jointly models multiple intermediate shape concepts, based on the rendered synthetic images. The processor is also configured to perform an intra-class appearance variation-aware and occlusion-aware 3D object parsing on the actual image by applying the CNN to the actual image to output an image pair including a 2D and 3D geometric structure of the object. The processor is additionally configured to perform an action to mitigate a likelihood of harm involving the motor vehicle, based on the image pair.

20 Claims, 15 Drawing Sheets

(51) Int. Cl.

| | |
|---|---|
| *G06K 9/46* | (2006.01) |
| *G06K 9/62* | (2006.01) |
| *G06N 3/02* | (2006.01) |
| *G06N 3/08* | (2006.01) |
| *G06T 7/55* | (2017.01) |
| *G06T 7/73* | (2017.01) |
| *G08G 1/16* | (2006.01) |
| *H04N 7/00* | (2011.01) |
| *B60W 30/00* | (2006.01) |
| *G06F 17/50* | (2006.01) |
| *G06T 11/60* | (2006.01) |
| *G06T 15/10* | (2011.01) |
| *G06T 15/40* | (2011.01) |
| *G08G 1/0962* | (2006.01) |

(52) U.S. Cl.
CPC ..... *G06F 17/5009* (2013.01); *G06K 9/00201* (2013.01); *G06K 9/00208* (2013.01); *G06K 9/00624* (2013.01); *G06K 9/00771* (2013.01); *G06K 9/00805* (2013.01); *G06K 9/6255* (2013.01); *G06N 3/02* (2013.01); *G06N 3/084* (2013.01); *G06T 7/74* (2017.01); *G06T 11/60* (2013.01); *G06T 15/10* (2013.01); *G06T 15/40* (2013.01); *G08G 1/0962* (2013.01); *G08G 1/166* (2013.01); *H04N 7/00* (2013.01); *B60T 2201/022* (2013.01); *G06K 9/4628* (2013.01); *G06T 7/55* (2017.01); *G06T 2207/20101* (2013.01); *G06T 2207/30261* (2013.01); *G06T 2210/22* (2013.01)

(58) Field of Classification Search
CPC ............ G06F 17/5009; G06K 9/00201; G06K 9/00208; G06K 9/00624; G06K 9/00771; G06K 9/00805; G06K 9/6255; G06N 3/02; G06N 3/084; G08G 1/0962; G08G 1/166; H04N 7/00
USPC ........................................................ 701/301
See application file for complete search history.

(56) References Cited

OTHER PUBLICATIONS

Tulsiani, et al., "Viewpoints and Keypoints", IEEE Conference on Computer Vision and Pattern Recognition, Jun. 2015, pp. 1510-1519.
Wu et al. "Single Image 3D Interpreter Network", European Conference on Computer Vision (ECCV), Oct. 2016, pp. 365-382.
Yu, et al., "Deep Deformation Network for Object Landmark Localization", European Conference on Computer Vision (ECCV), Oct. 2016, pp. 52-70.
Zeeshan Zia, et al., "Towards Scene Understanding with Detailed 3D Object Representations", International Journal of Computer Vision, Apr. 2015, pp. 188-203.
Hao Su et al., "Render for CNN: Viewpoint Estimation in Images Using CNNs Trained with Rendered 3D Model Views", IEEE International Conference on Computer Vision (ICCV), 2015, pp. 2686-2694. (See p. 2686, right column, lines 6-8; p. 2686, left column, lines 18-19; p. 2687, right column, lines 6-10; p. 2688, right column, lnes 14-18; and figures 1-2.
Min Lin et al., Network in Network, International Conference on Learning Representations (ICLR), 2014. (See pp. 7-8).

ADVANCED DRIVER-ASSISTANCE SYSTEM WITH LANDMARK LOCALIZATION ON OBJECTS IN IMAGES USING CONVOLUTIONAL NEURAL NETWORKS

RELATED APPLICATION INFORMATION

This application claims priority to provisional application Ser. No. 62/418,894 filed on Nov. 8, 2016, incorporated herein by reference. This application is related to an application entitled "Landmark Localization On Objects In Images Using Convolutional Neural Networks", Ser. No. 15/709,748, and which is incorporated by reference herein in its entirety. This application is related to an application entitled "Surveillance System With Landmark Localization On Objects In Images Using Convolutional Neural Networks", Ser. No. 15/709,849, and which is incorporated by reference herein in its entirety. This application is related to an application entitled "Action Recognition System With Landmark Localization On Objects In Images Using Convolutional Neural Networks", Ser. No. 15/709,897, and which is incorporated by reference herein in its entirety.

BACKGROUND

Technical Field

The present invention relates to object parsing, and more particularly to Advanced Driver-Assistance System with landmark localization on objects in images using convolutional neural networks.

Description of the Related Art

Parsing 3D object geometry is a critical capability for occlusion reasoning and scene understanding. However, current approaches to parsing 3D object geometry suffer from many deficiencies including, but not limited to, the lack of joint optimization for 2D and 3D keypoints, partial view ambiguity, 3D prediction errors, applicability to only low resolution images, and so forth.

Thus, there is a need for an improved approach to landmark localization on objects in images, particularly in relation to Advanced Driver-Assistance Systems.

SUMMARY

According to an aspect of the present invention, a system is provided for driving assistance. The system includes an image capture device configured to capture an actual image relative to an outward view from a motor vehicle and depicting an object. The system further includes a processor. The processor is configured to render, based on a set of 3D Computer Aided Design (CAD) models, a set of synthetic images with corresponding intermediate shape concept labels. The processor is further configured to form a multi-layer Convolutional Neural Network (CNN) which jointly models multiple intermediate shape concepts, based on the rendered synthetic images. The processor is also configured to perform an intra-class appearance variation-aware and occlusion-aware 3D object parsing on the actual image by applying the CNN to the actual image to output an image pair including a 2D geometric structure and a 3D geometric structure of the object depicted in the actual image. The processor is additionally configured to perform an action to mitigate a likelihood of potential harm involving the motor vehicle, based on the image pair.

According to another aspect of the present invention, a method is provided for driving assistance. The method includes capturing, by an image capture device, an actual image relative to an outward view from a motor vehicle and depicting an object. The method further includes rendering, by a processor based on a set of 3D Computer Aided Design (CAD) models, a set of synthetic images with corresponding intermediate shape concept labels. The method also includes forming, by the processor, a multi-layer Convolutional Neural Network (CNN) which jointly models multiple intermediate shape concepts, based on the rendered synthetic images. The method additionally includes performing, by the processor, an intra-class appearance variation-aware and occlusion-aware 3D object parsing on the actual image by applying the CNN to the actual image to output an image pair including a 2D geometric structure and a 3D geometric structure of the object depicted in the actual image. The method also includes performing an action to mitigate a likelihood of potential harm involving the motor vehicle, based on the image pair.

According to yet another aspect of the present invention, a computer program product is provided for driving assistance. The computer program product includes a non-transitory computer readable storage medium having program instructions embodied therewith. The program instructions are executable by a computer to cause the computer to perform a method. The method includes capturing, by an image capture device, an actual image relative to an outward view from a motor vehicle and depicting an object. The method further includes rendering, by a processor based on a set of 3D Computer Aided Design (CAD) models, a set of synthetic images with corresponding intermediate shape concept labels. The method also includes forming, by the processor, a multi-layer Convolutional Neural Network (CNN) which jointly models multiple intermediate shape concepts, based on the rendered synthetic images. The method additionally includes performing, by the processor, an intra-class appearance variation-aware and occlusion-aware 3D object parsing on the actual image by applying the CNN to the actual image to output an image pair including a 2D geometric structure and a 3D geometric structure of the object depicted in the actual image. The method also includes performing an action to mitigate a likelihood of potential harm involving the motor vehicle, based on the image pair.

These and other features and advantages will become apparent from the following detailed description of illustrative embodiments thereof, which is to be read in connection with the accompanying drawings.

BRIEF DESCRIPTION OF DRAWINGS

The disclosure will provide details in the following description of preferred embodiments with reference to the following figures wherein.

DETAILED DESCRIPTION OF PREFERRED EMBODIMENTS

Figure 1:
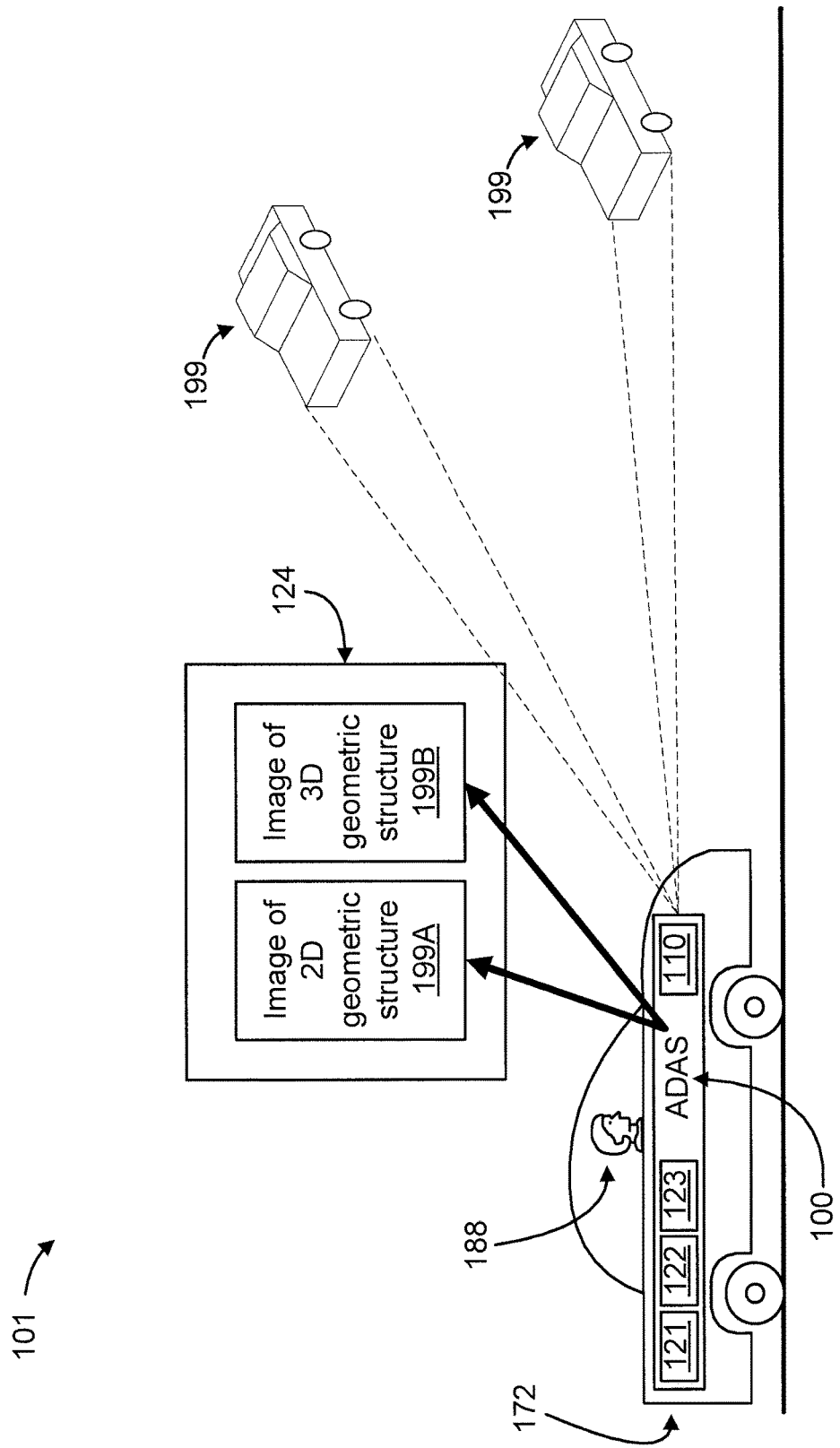
FIG. 1 shows an exemplary Advanced Driver-Assistance System (ADAS) with landmark localization on objects in images using convolutional neural networks, in accordance with an embodiment of the present invention.

The present invention is directed to Advanced Driver-Assistance System with landmark localization on objects in images using convolutional neural networks.

In an embodiment, a deep Convolutional Neural Network (CNN) is provided to localize object semantic parts in two-dimensional (2D) image domain and three-dimensional (3D) space given a single RGB image. The reconstruction of the 3D object structure involves building a variety of 3D-related concepts such as object pose and visibility of object parts. In an embodiment, the CNN is trained by hierarchically supervising the CNN with these aspects at different depths, in order to sequentially recover intermediate and final 2D/3D shape properties in the inverse rendering. In an embodiment, to provide diverse data with the structured labels needed in training, a number of synthetic training images are generated by rendering object CAD models under different viewpoints, lighting conditions, real image backgrounds and occlusion patterns.

Hence, in an embodiment, the present principles provide an approach for intra-class appearance variation-aware and occlusion-aware 3D object parsing, where "intra-class appearance variation aware" refers to being able to distinguish between appearance variations of objects in the same class for the sake of object parsing, and where "occlusion-aware 3D object parsing" refers to being able to parse an object despite the presence of an occlusion to the object.

Given the present invention's applicability to object parsing, it is to be appreciated that the term "object" can refer to an object in whole or a portion(s) of the object.

For the sake of illustration, various embodiments of the present invention are described with respect to four exemplary applications, namely (1) 3D object parsing, (2) Advanced Driver-Assistance System (ADAS), (3) surveillance, and (4) action recognition. Of course, the present invention can be used for other applications, as readily appreciated by one of ordinary skill in the art, while maintaining the spirit of the present invention.

In an embodiment, the input to an application, such as any of the aforementioned four applications or some other application, is an image that includes one or multiple objects (cars, humans, etc.). However, the input to the CNN is an image that contains only one object, which is either fully visible or partially occluded. Therefore, for the four applications, we will first run an object detection method on the input image to get a bounding box for each object, which becomes the input image for the CNN. In other words, we will run the CNN multiple times (one time for one bounding box cropped from the original input image). Similarly, the rendered synthetic images for training the CNN also contain only one object, which is either fully visible or partially occluded. In cases of occlusion rendering, we put two objects nearby, project them both to the image plane, and crop one bounding box for each object.

Various exemplary applications will now be described to which the present invention can be applied.

FIG. 1 shows an exemplary Advanced Driver-Assistance System (ADAS) 100 with landmark localization on objects in images using convolutional neural networks, in accordance with an embodiment of the present invention.

The ADAS 100 is used in an environment 101 wherein a user 188 is located in a scene with multiple objects 199, each having their own locations and trajectories. The user 188 is operating a vehicle 172 (e.g., a car, a truck, a motorcycle, etc.).

The ADAS 100 includes a camera system 110. While a single camera system 110 is shown in FIG. 1 for the sakes of illustration and brevity, it is to be appreciated that multiple camera systems can be also used, while maintaining the spirit of the present invention.

The ADAS 100 further includes a server 120 configured to perform advanced driver assistance functions (hereinafter "driver assistance functions" in short) based on landmark localization on objects 199 including 3D object parsing (hereinafter "landmark localization" in short) in accordance with the present invention. The server 120 can include a processor 121, a memory 122, and a wireless transceiver 123. The processor 121 and the memory 122 of the remote server 120 can be configured to perform driver assistance functions based on images received from the camera system 110 by (the wireless transceiver 123 of) the remote server 120. In this way, based on an input image depicting an object(s), the server 120 can output and/or otherwise provide an image 199A of a 2D geometric structure of the object(s) 199 and an image 199B of a 3D geometric structure (e.g., a skeletonized structure) of the object(s) 199 to the user 188 and/or the vehicle 172 in order for corrective action to be taken by the user 188 and/or the vehicle 172. Possible corrective actions can involve one or more actions performed responsive to the output images or data relating thereto, as readily appreciated by one of ordinary skill in the art. In an embodiment, the images 199A and 199B can be provided on a display 124 coupled to the server 120. The display 124 may be a heads-up display projected onto the windshield of the vehicle 172. Of course, other implementations for presenting the data depicted in the images to a user can also be used, while maintaining the spirit of the present invention.

The ADAS 100 can interface with the user through one or more systems of the vehicle 172 that the user is operating. For example, the ADAS 100 can provide the user information (e.g., detected objects 199 (or portions of the detected objects 199), their locations, suggested actions, etc.) through a system (e.g., a display system, a speaker system, and/or some other system) of the vehicle 172. Moreover, the ADAS 100 can interface with the vehicle 172 itself (e.g., through one or more systems of the vehicle 172 including, but not limited to, a steering system, a braking system, an acceleration system, etc.) in order to control the vehicle or cause the vehicle 172 to perform one or more actions. In this way, the user or the vehicle 172 itself can navigate around these objects 199 to avoid potential collisions there between.

Figure 2:
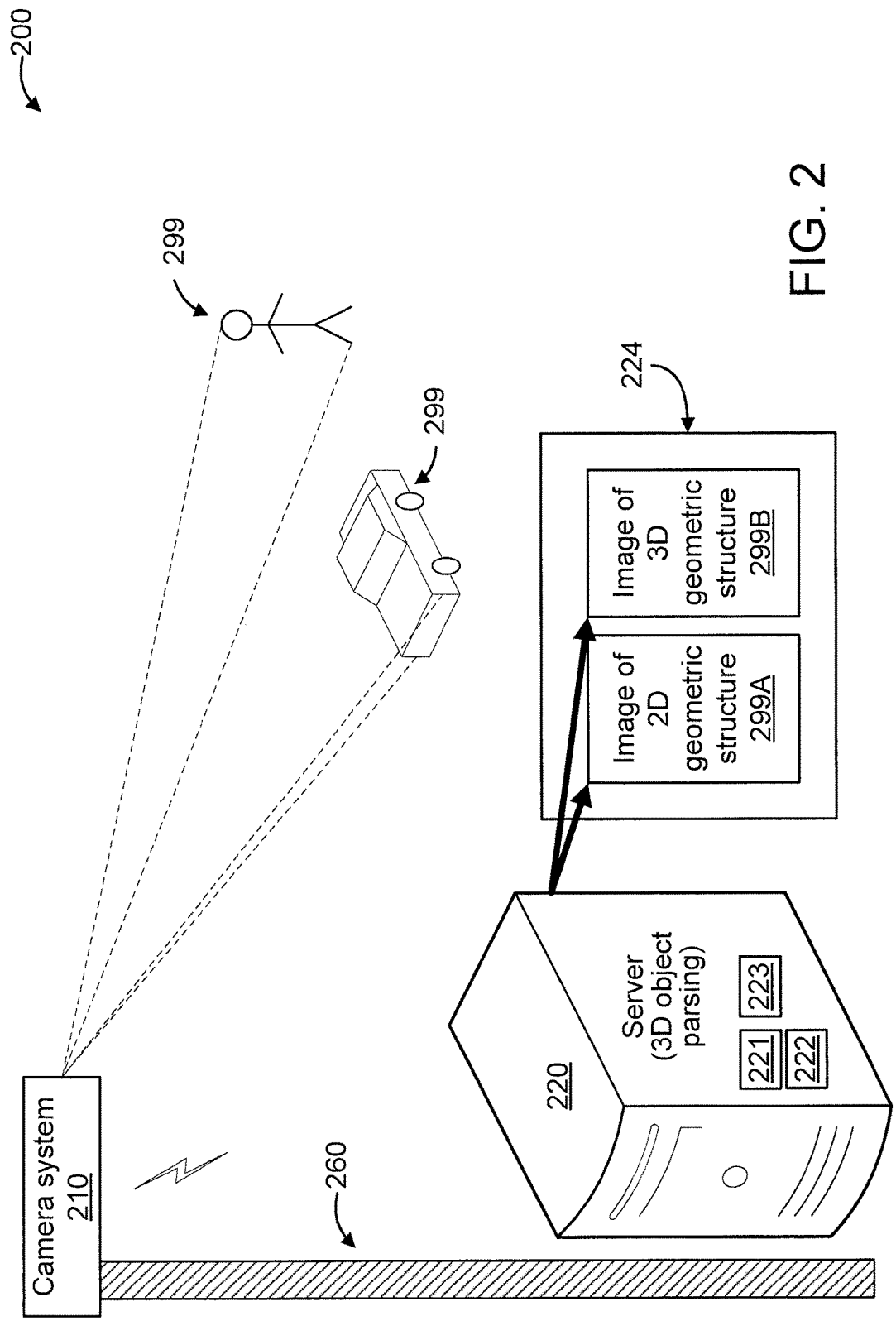
FIG. 2 shows an exemplary system for landmark localization on objects in images using convolutional neural networks, in accordance with an embodiment of the present invention.

FIG. 2 shows an exemplary system 200 for landmark localization on objects in images using convolutional neural networks, in accordance with an embodiment of the present invention.

The system 200 includes a camera system 210. While a single camera system 210 is shown in FIG. 2 for the sakes of illustration and brevity, it is to be appreciated that multiple camera systems can be also used, while maintaining the spirit of the present invention.

In the embodiment of FIG. 2, the camera system 210 is mounted on a mounting entity 260. For the sake of illustration, the mounting entity 260 is a pole. While a pole 260 is shown (as a mounting entity) for the sake of illustration, any other mounting entity can be used, as readily appreciated by one of ordinary skill in the art given the teachings of the present invention provided herein, while maintaining the spirit of the present invention. For example, the camera system 210 can be mounted in or on any of the following: a building; a drone; a vehicle; and so forth. The preceding examples are merely illustrative.

The camera system 210 can be a wireless camera system having its own antenna(s) or can use one or more antennas included on the pole 260 (or other mounting entity (e.g., building, drone, vehicle, etc.) to which the camera system 210 is mounted or proximate).

The system 200 further includes a server 220 configured to perform landmark localization on objects 299 including 3D object parsing (hereinafter "landmark localization" in short) in accordance with the present invention. The landmark localization can involve detecting the presence of objects, identifying the locations of the objects, parsing the objects into portions, identifying particular actions performed by the objects or the portions thereof, and/or performing one or more actions (e.g., in response to any of: the detecting of the objects; the identifying of the object locations; the parsing of the objects; and/or the output 2D image and/or output 3D image described further herein below). The server 220 can be located remote from, or proximate to, the camera system 210. The server 220 can include, e.g., a processor 221, a memory 222, and a wireless transceiver 223. The processor 221 and the memory 222 of the remove server 220 can be configured to perform landmark localization based on images received from the camera system 210 by (the wireless transceiver 223 of) the remote server 220.

In this way, based on an input image depicting an object(s), the server 220 can output and/or otherwise provide an image 299A of a 2D geometric structure of the object(s) 299 (or a portion(s) thereof) and/or an image 299B of a 3D geometric structure (e.g., a skeletonized structure) of the object(s) 299 (or a portion(s) thereof) for any of a myriad of possible application uses. Such application uses can involve one or more actions performed responsive to the output images or data relating thereto, as readily appreciated by one of ordinary skill in the art. In an embodiment, the images 299A and 299B can be provided on a display 224 coupled to the server 220.

Accordingly, some exemplary suitable environments to which the present invention can be applied can include any environments where object detection can be used. For example, exemplary suitable environments include, but are not limited to, a driving environment, an environment to be surveilled, a sports or other event, a battle field, a riot scenario, a picketing scenario, video analysis, object reconstruction, and so forth.

Figure 3:
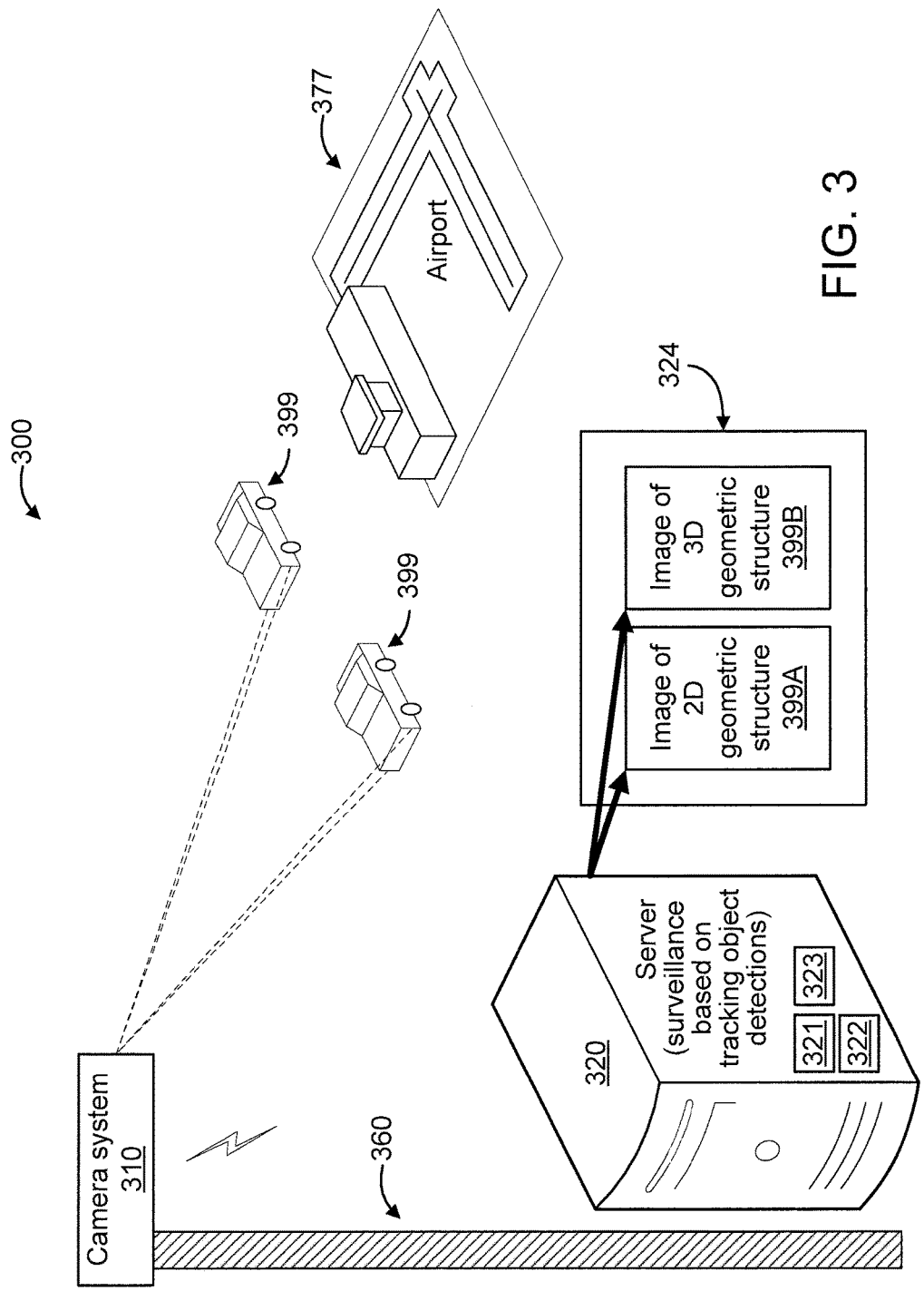
FIG. 3 shows an exemplary system for surveillance with landmark localization on objects in images using convolutional neural networks, in accordance with an embodiment of the present principles.

FIG. 3 shows an exemplary system 300 for surveillance with landmark localization on objects in images using convolutional neural networks, in accordance with an embodiment of the present principles.

The system 300 includes a camera system 310. While a single camera system 310 is shown in FIG. 3 for the sakes of illustration and brevity, it is to be appreciated that multiple camera systems can be also used, while maintaining the spirit of the present invention.

In the embodiment of FIG. 3, the camera system 310 is mounted on a mounting entity 360. For the sake of illustration, the mounting entity 360 is a pole. While a pole 360 is shown (as a mounting entity) for the sake of illustration, any other mounting entity can be used, as readily appreciated by one of ordinary skill in the art given the teachings of the present invention provided herein, while maintaining the spirit of the present invention. For example, the camera system 310 can be mounted in or on any of the following: a building; and so forth. The preceding examples are merely illustrative.

The camera system 310 can be a wireless camera system having its own antenna(s) or can use one or more antennas included on the pole 360 (or other mounting entity (e.g., building, drone, etc.) to which the camera system 310 is mounted or proximate).

The system 300 further includes a server 320 configured to perform surveillance based on landmark localization on objects 399 including 3D object parsing (hereinafter "landmark localization" in short) in accordance with the present invention. Such surveillance can be with respect to a secured object such as, for example, a secured facility 377. In the example of FIG. 3, the secured facility is an airport. Of course, other secured facilities can also be surveilled in accordance with the present invention. The surveillance can involve detecting the presence of objects, identifying the locations of the objects, parsing the objects into portions, identifying particular actions performed by the objects or the portions thereof, and/or performing one or more actions (e.g., in response to any of: the detecting of the objects; the identifying of the object locations; the parsing of the objects; and/or the output 2D image and/or output 3D image described further herein below). The server 320 can be located remote from, or proximate to, the camera system 310. The server 320 can include a processor 321, a memory 322, and a wireless transceiver 323. The processor 321 and the memory 322 of the remote server 320 can be configured to perform surveillance based on images received from the camera system 310 by (the wireless transceiver 323 of) the remote server 320.

In this way, based on an input image depicting an object(s), the server 320 can output and/or otherwise provide an image 399A of a 2D geometric structure of the object(s) 399 (or a portion(s) thereof) and/or an image 399B of a 3D geometric structure (e.g., a skeletonized structure) of the object(s) 399 (or a portion(s) thereof) for any of a myriad of possible surveillance application uses. In an embodiment, the images 399A and 399B can be provided on a display 324 coupled to the server 320. In an embodiment, possible surveillance application uses can involve one or more actions performed responsive to the output images or data relating thereto, as readily appreciated by one of ordinary skill in the art. For example, an alert (local and/or remote) can be provided, one or more doors and/or windows can be closed and locked to secure the person within a specific area or to keep the person from (out of) that specific area, a person containment procedure can be automatically performed, and so forth.

Accordingly, some exemplary suitable environments to which the present invention can be applied can include any environments where surveillance can prove useful such as mass transit hubs, border crossings, subways, transportation hubs, airports, ship ports, and so forth. It is to be appreciated that the preceding environments are merely illustrative and, thus, other environments can also be used, while maintaining the spirit of the present invention.

Figure 4:
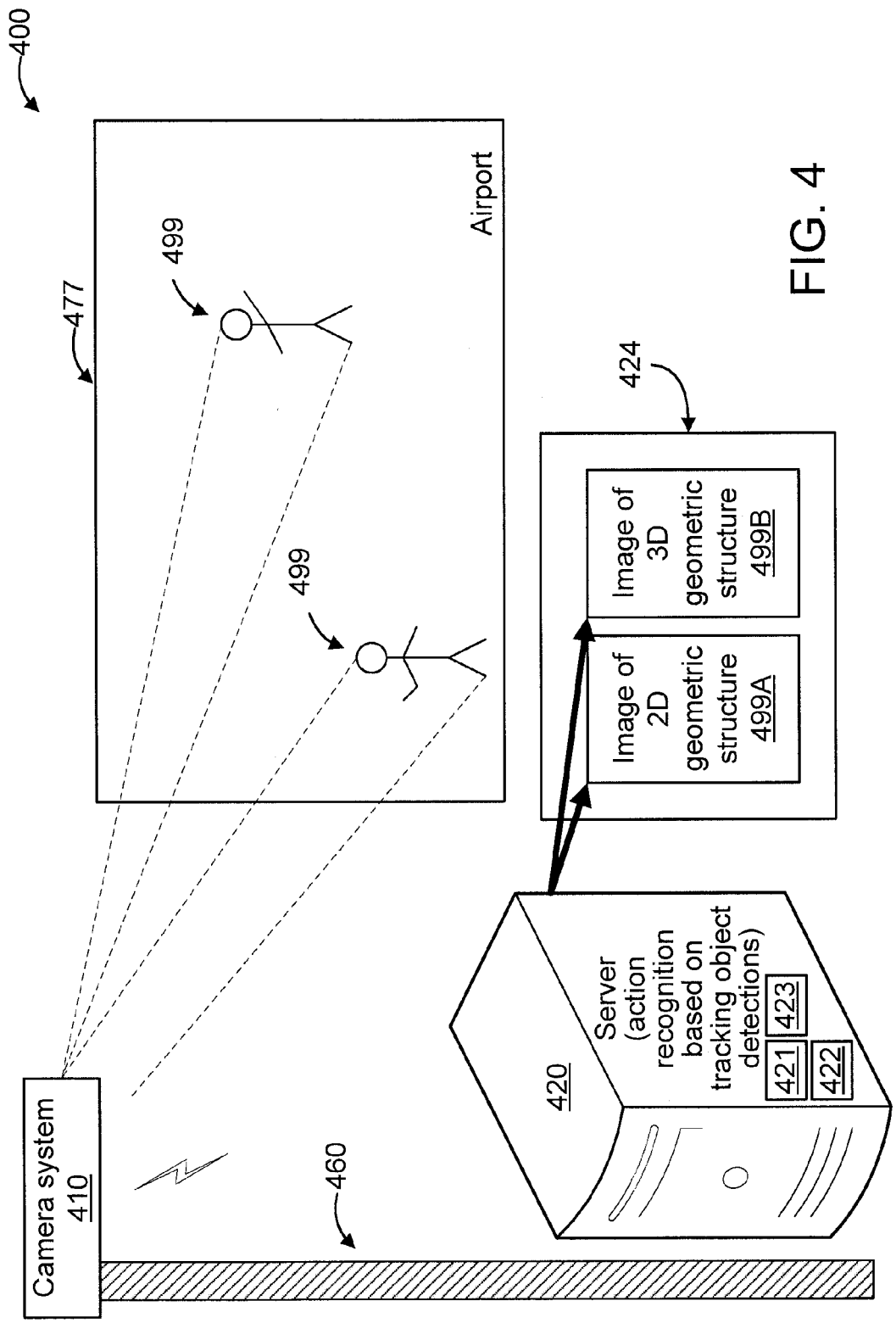
FIG. 4 shows an exemplary system for action recognition with landmark localization on objects in images using convolutional neural networks, in accordance with an embodiment of the present invention.

FIG. 4 shows an exemplary system 400 for action recognition with landmark localization on objects in images using convolutional neural networks, in accordance with an embodiment of the present invention.

The system 400 includes a camera system 410. While a single camera system 410 is shown in FIG. 4 for the sakes of illustration and brevity, it is to be appreciated that multiple camera systems can be also used, while maintaining the spirit of the present invention.

In the embodiment of FIG. 4, the camera system 410 is mounted on a mounting entity 460. For the sake of illustration, the mounting entity 460 is a pole. While a pole 460 is shown (as a mounting entity) for the sake of illustration, any other mounting entity can be used, as readily appreciated by one of ordinary skill in the art given the teachings of the present invention provided herein, while maintaining the spirit of the present invention. For example, the camera system 410 can be mounted in or on any of the following: a building; and so forth. The preceding examples are merely illustrative.

The camera system 410 can be a wireless camera system having its own antenna(s) or can use one or more antennas included on the pole 460 (or other mounting entity (e.g., building, drone, etc.) to which the camera system 410 is mounted or proximate).

The system 400 further includes a server 420 configured to perform action recognition based on landmark localization on objects 499 including 3D object parsing (hereinafter "landmark localization" in short) in accordance with the present invention. Such action recognition can be with respect to a secured object such as, for example, a facility 477 or a portion of the facility 477. The facility can be a secured facility or a non-secured facility. In the example of FIG. 4, the facility is a secured facility implemented as an airport. In an embodiment, a portion of the facility can be involved such as a departure terminal, etc. Of course, other facilities (e.g., mass transit hub, sports complex, etc.) and/or portions thereof and/or other portions of the aforementioned facility can also be monitored with respect to action recognition based on landmark localization in accordance with the present invention. The action recognition can involve detecting the presence of objects, identifying the locations of the objects, parsing the objects into object portions, identifying particular actions performed by the objects and/or object portions and/or particular actions performed by one or more persons using the objects and/or object portions, and/or performing one or more actions (e.g., in response to any of: the detecting of the objects; the identifying of the object locations; the parsing of the objects; the recognition of an action performed by the objects and/or object portions and/or the output 2D image and/or output 3D image described further herein below). The server 420 can be located remote from, or proximate to, the camera system 410. The server 420 can include a processor 421, a memory 422, and a wireless transceiver 423. The processor 421 and the memory 422 of the remote server 420 can be configured to perform action recognition based on images received from the camera system 410 by (the wireless transceiver 423 of) the remote server 420.

In this way, based on an input image depicting an object(s), the server 420 can output and/or otherwise provide an image 499A of a 2D geometric structure of the object(s) 499 (or a portion(s) thereof) and/or an image 499B of a 3D geometric structure (e.g., a skeletonized structure) of the object(s) 499 (or a portion(s) thereof) for any of a myriad of possible action recognition application uses. In an embodiment, the images 499A and 499B can be provided on a display 424 coupled to the server 420. In an embodiment, possible action recognition application uses can involve one or more actions performed responsive to the list, as readily appreciated by one of ordinary skill in the art. For example, an alert (local and/or remote) can be provided, one or more doors and/or windows can be closed and locked to secure the person within a specific area or to keep the person from (out of) that specific area, a person containment procedure can be automatically performed, and so forth.

Accordingly, some exemplary suitable environments to which the present invention can be applied can include any environments where action recognition can prove useful such as mass transit hubs, border crossings, subways, transportation hubs, airports, ship ports, sports facilities, and so forth. It is to be appreciated that the preceding environments are merely illustrative and, thus, other environments can also be used, while maintaining the spirit of the present invention.

Any action type of interest can be recognized, depending upon the implementation. For example, the action may include, but is not limited to, one or more of the following: an intruder running up to a premises or an object; a projectile approaching the premises or the object; a sporting action; a prohibited action (e.g., holding a weapon in a place where weapons are prohibited except for, e.g., law enforcement, etc.); a potentially dangerous action; and so forth. It is to be appreciated that the preceding actions are merely illustrative.

Figure 5:
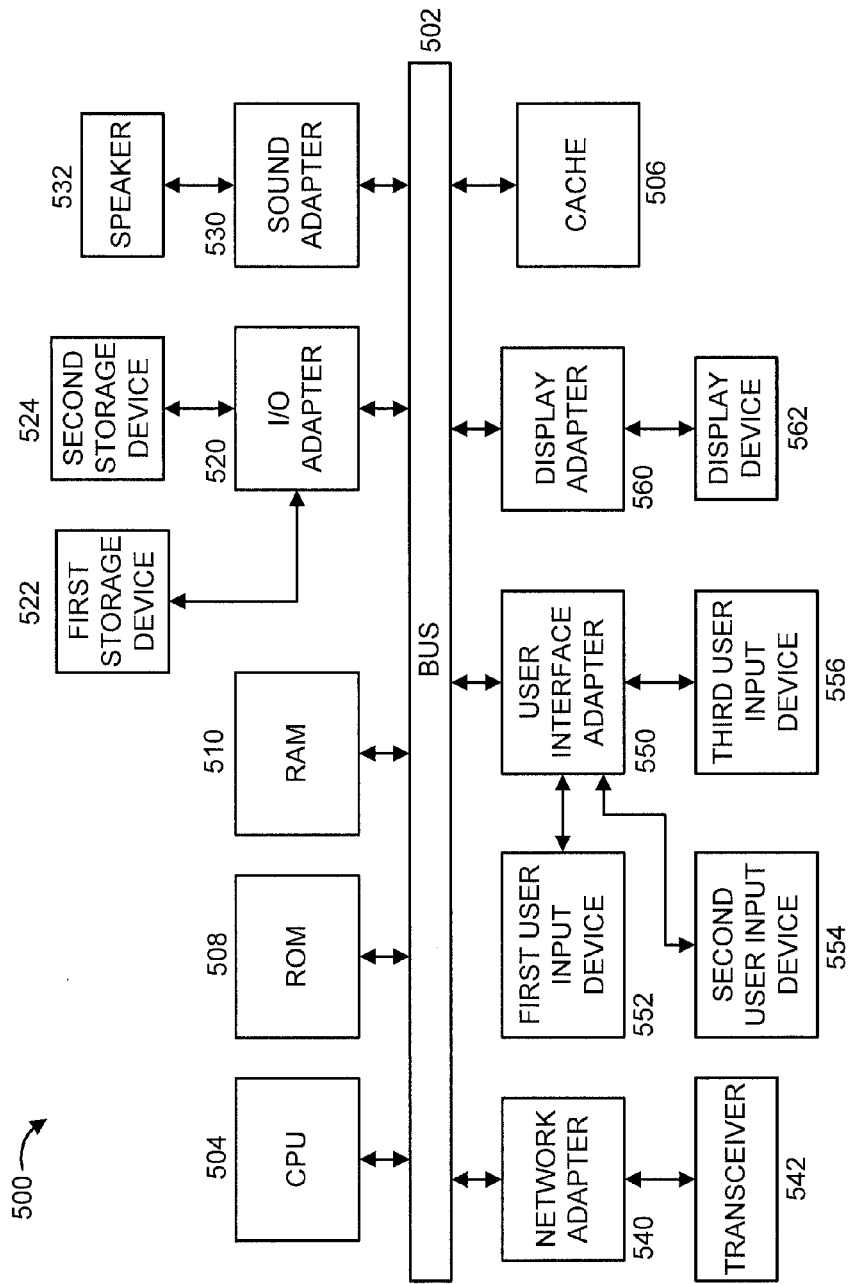
FIG. 5 shows an exemplary processing system to which the present principles may be applied, according to an embodiment of the present principles.
Figure 6:
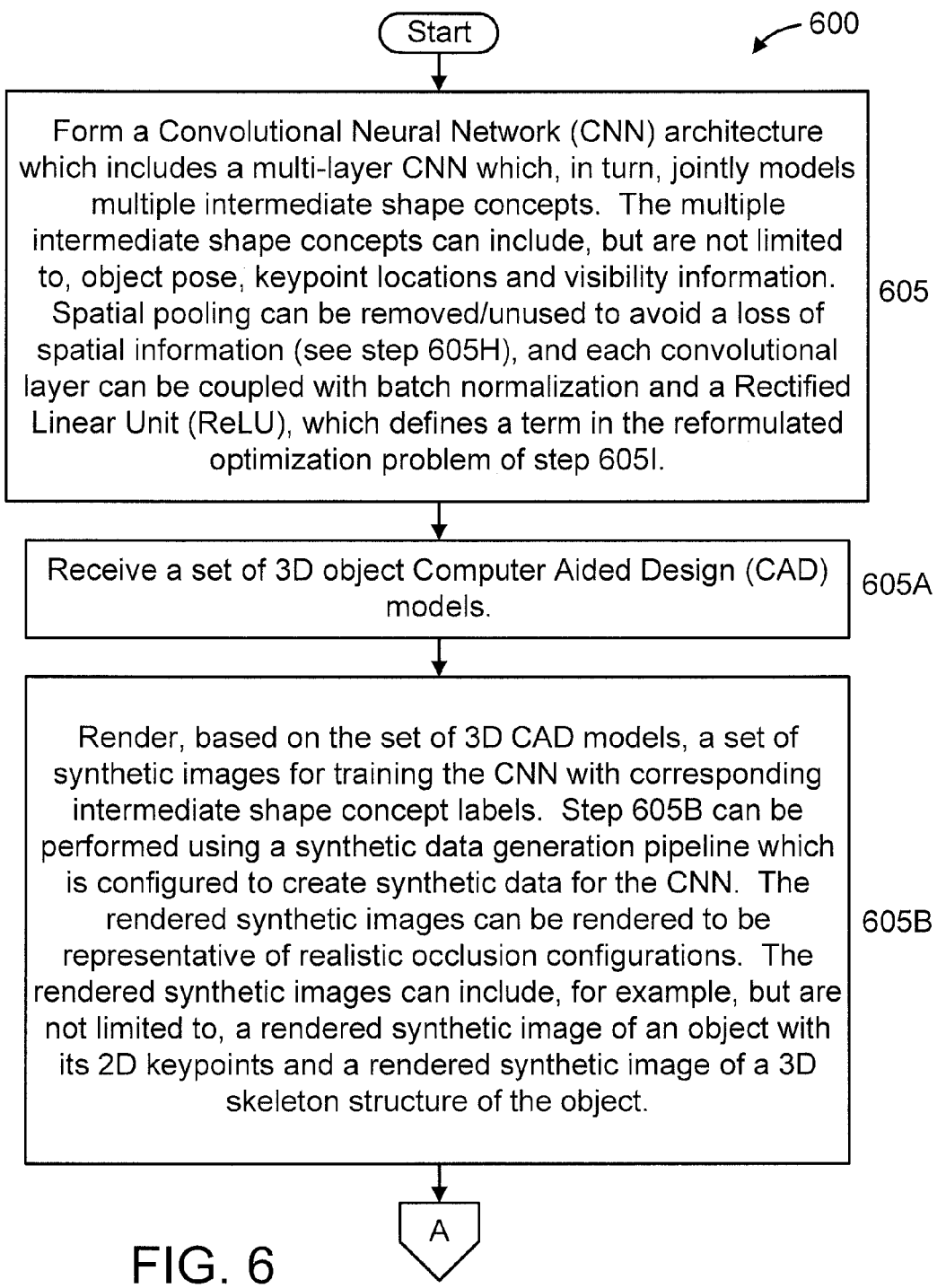
FIGS. 6-13 show an exemplary method for landmark localization on objects in images using convolutional neural networks, in accordance with an embodiment of the present principles.

FIG. 5 shows an exemplary processing system 500 to which the present principles may be applied, according to an embodiment of the present principles. In an embodiment, the server 120 of FIG. 1 and/or the server 220 of FIG. 2 and/or the server 320 of FIG. 3 and/or the server 420 of FIG. 4 can be implemented, at least in part, by processing system 500.

The processing system 500 includes at least one processor (CPU) 504 operatively coupled to other components via a system bus 502. A cache 506, a Read Only Memory (ROM) 508, a Random Access Memory (RAM) 510, an input/output (I/O) adapter 520, a sound adapter 530, a network adapter 540, a user interface adapter 550, and a display adapter 560, are operatively coupled to the system bus 502.

A first storage device 522 and a second storage device 524 are operatively coupled to system bus 502 by the I/O adapter 520. The storage devices 522 and 524 can be any of a disk storage device (e.g., a magnetic or optical disk storage device), a solid state magnetic device, and so forth. The storage devices 522 and 524 can be the same type of storage device or different types of storage devices.

A speaker 532 is operatively coupled to system bus 502 by the sound adapter 530. A transceiver 542 is operatively coupled to system bus 502 by network adapter 540. A display device 562 is operatively coupled to system bus 502 by display adapter 560.

A first user input device 552, a second user input device 554, and a third user input device 556 are operatively coupled to system bus 502 by user interface adapter 550. The user input devices 552, 554, and 556 can be any of a keyboard, a mouse, a keypad, an image capture device, a motion sensing device, a microphone, a device incorporating the functionality of at least two of the preceding devices, and so forth. Of course, other types of input devices can also be used, while maintaining the spirit of the present principles. The user input devices 552, 554, and 556 can be the same type of user input device or different types of user input devices. The user input devices 552, 554, and 556 are used to input and output information to and from system 500.

Of course, the processing system 500 may also include other elements (not shown), as readily contemplated by one of skill in the art, as well as omit certain elements. For example, various other input devices and/or output devices can be included in processing system 500, depending upon the particular implementation of the same, as readily understood by one of ordinary skill in the art. For example, various types of wireless and/or wired input and/or output devices can be used. Moreover, additional processors, controllers, memories, and so forth, in various configurations can also be utilized as readily appreciated by one of ordinary skill in the art. These and other variations of the processing system 500 are readily contemplated by one of ordinary skill in the art given the teachings of the present principles provided herein.

Moreover, it is to be appreciated that systems 100, 200, 300, and 400 described above with respect to FIGS. 1, 2, 3, and 4, respectively, are systems for implementing respective embodiments of the present principles. Part or all of processing system 500 may be implemented in one or more of the elements of any of systems 100, 200, 300, and 400.

Further, it is to be appreciated that system 500 may perform at least part of the method described herein including, for example, at least part of method 600 of FIGS. 6-13. Similarly, part or all of any of systems 200, 300, 400, and/or 500 may be used to perform at least part of method 600 of FIGS. 6-13.

FIGS. 6-13 show an exemplary method 600 for tracking object detections, in accordance with an embodiment of the present principles. The method 600 can infer, from a single view (RGB image) of the object, the locations of keypoints in 2D and 3D spaces and their visibility. In an embodiment, step 605 can be considered to correspond to a training phase or stage, while steps 610-615 can be considered to correspond to a recognition phase or stage. Moreover, step 620 can be considered to be part of the recognition phase/stage.

At step 605, form a Convolutional Neural Network (CNN) architecture which includes a multi-layer CNN which, in turn, jointly models multiple intermediate shape concepts. In an embodiment, the multiple intermediate shape concepts can include, but are not limited to, object pose, keypoint locations and visibility information. In an embodiment, spatial pooling can be removed/unused to avoid a loss of spatial information (see step 605H), and each convolutional layer can be coupled with batch normalization and a Rectified Linear Unit (ReLU), which defines a term in the reformulated optimization problem of step 605I.

In an embodiment, step 605 can include one or more of steps 605A-I.

At step 605A, receive a set of 3D object Computer Aided Design (CAD) models.

At step 605B, render, based on the set of 3D CAD models, a set of synthetic images for training the CNN with corresponding intermediate shape concept labels. In an embodiment, step 605B can be performed using a synthetic data generation pipeline which is configured to create synthetic data for the CNN (e.g., in the form of rendered synthetic images). In an embodiment, the rendered synthetic images can be rendered to be representative of realistic occlusion configurations caused by, e.g., multiple objects in close proximity, image boundary truncations, and/or so forth. In an embodiment, the rendered synthetic images can include, for example, but are not limited to, a rendered synthetic image of an object with its 2D keypoints and a rendered synthetic image of a 3D skeleton structure of the object.

In an embodiment, step 605B can include one or more of steps 605B1-B3.

Figure 7:
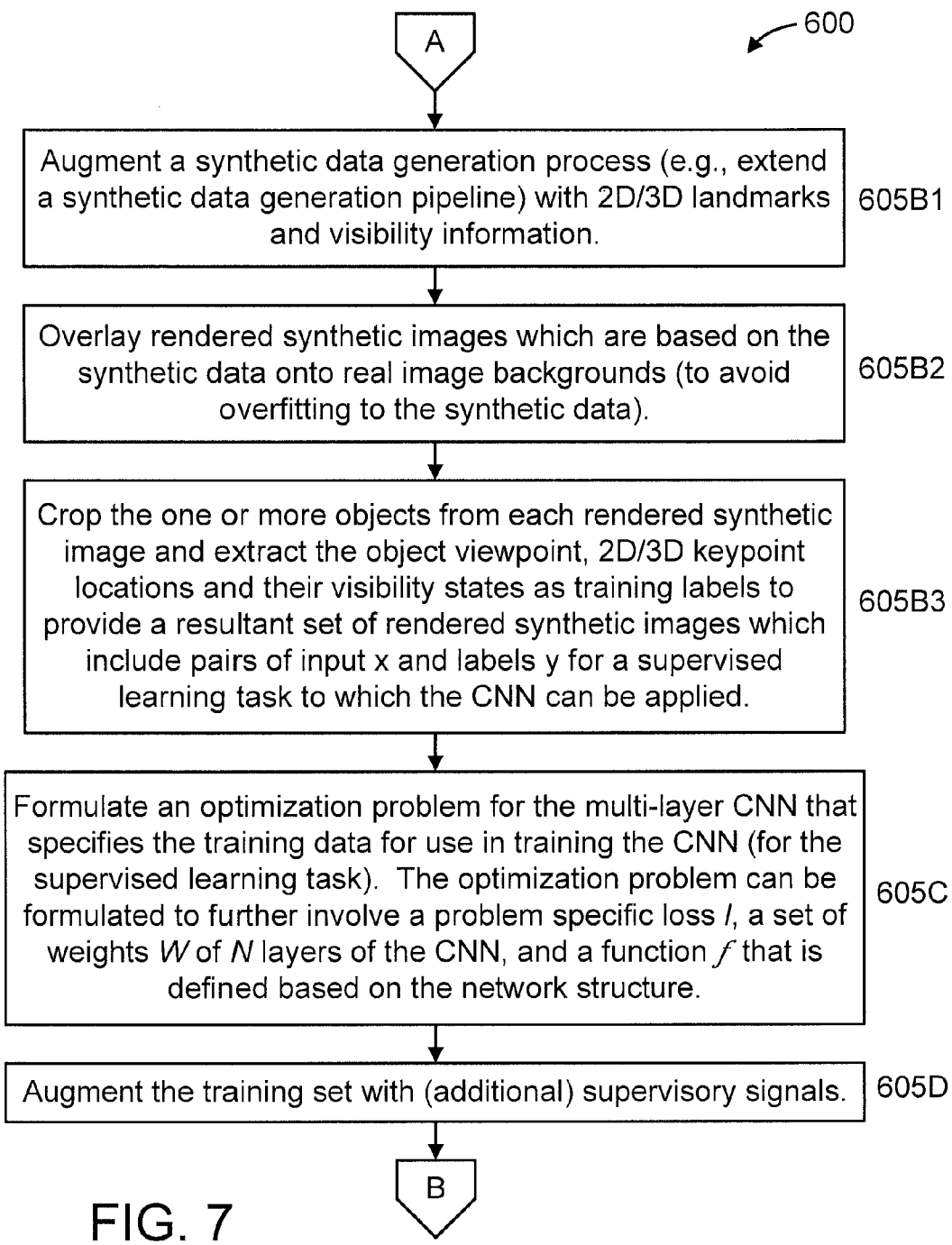

Referring to FIG. 7, at step 605B1, augment a synthetic data generation process (e.g., extend a synthetic data generation pipeline) with 2D/3D landmarks and visibility information.

At step 605B2, overlay rendered synthetic images which are based on the synthetic data onto real image backgrounds (to avoid overfitting to the synthetic data).

At step 605B3, crop the one or more objects from each rendered synthetic image and extract the object viewpoint, 2D/3D keypoint locations and their visibility states as training labels to provide a resultant set of rendered synthetic images which include pairs of input x and labels y for a supervised learning task to which the CNN can be applied.

At step 605C, formulate an optimization problem for the multi-layer CNN that specifies the training data for use in training the CNN (for the supervised learning task). In an embodiment, the optimization problem can be formulated to further involve a problem specific loss $1$, a set of weights W of N layers of the CNN, and a function $f$ that is defined based on the network structure.

At step 605D, augment the training set with (additional) supervisory signals.

Figure 8:
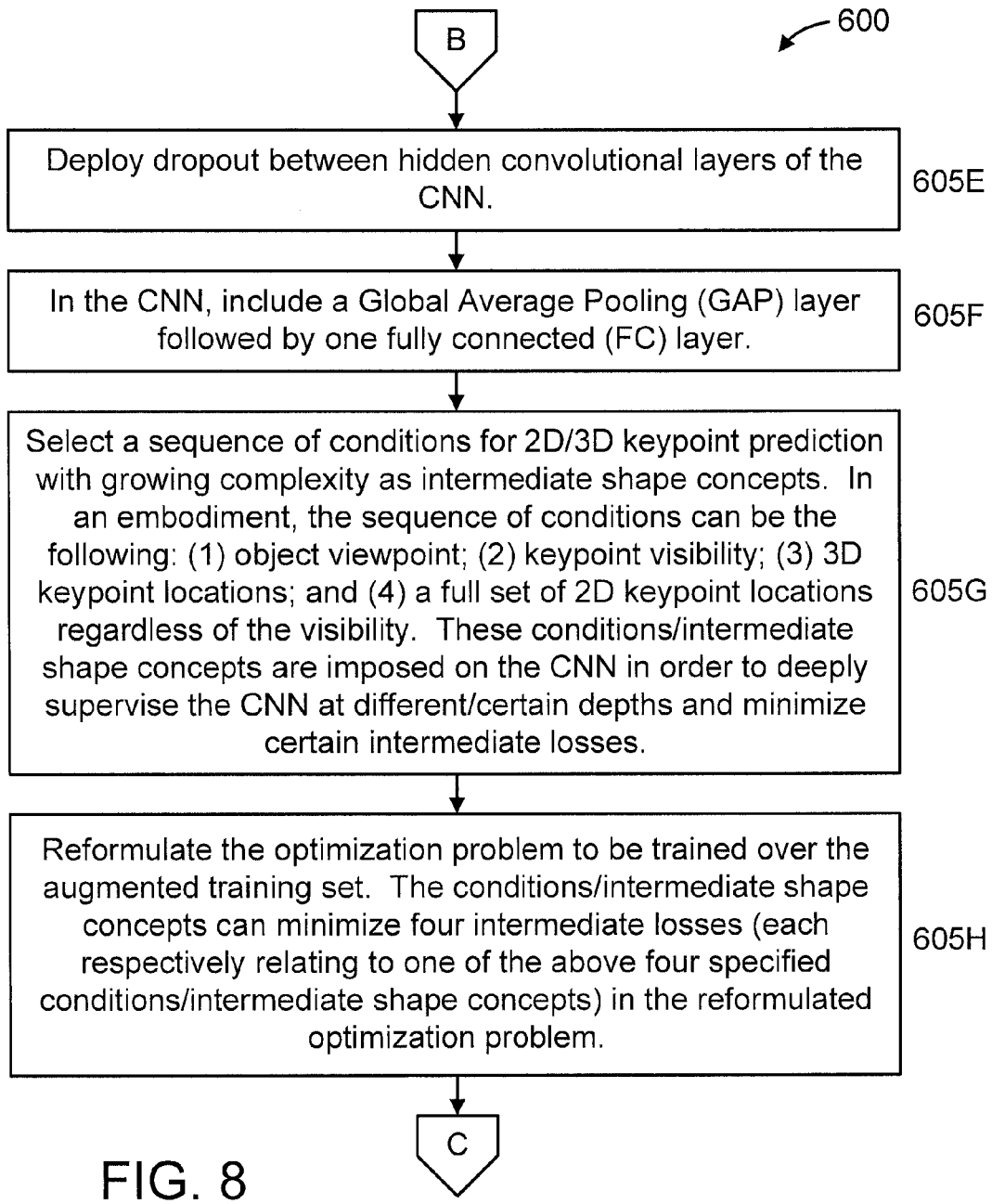

Referring to FIG. 8, at step 606E, deploy dropout between hidden convolutional layers of the CNN. In an embodiment, the dropout can be deployed to further address the problem of overfitting.

At step 605F, in the CNN, include a Global Average Pooling (GAP) layer followed by one fully connected (FC) layer.

At step 605G, select a sequence of conditions for 2D/3D keypoint prediction with growing complexity as intermediate shape concepts. In an embodiment, the sequence of conditions can be the following: (1) object viewpoint; (2) keypoint visibility; (3) 3D keypoint locations; and (4) a full set of 2D keypoint locations regardless of the visibility. These conditions/intermediate shape concepts are imposed on the CNN in order to deeply supervise the CNN at different/certain depths and minimize certain intermediate losses. These conditions/intermediate shape concepts can be considered to form a shape concept hierarchy, e.g., for governing the supervision of the CNN. Hence, step 605G can involve explicitly enforcing a condition(s) that hidden layers of the CNN yield a sequence of known intermediate concepts with growing complexity towards the final task, using the augmented training set. This explicit enforcement provides regularization to, e.g., address the problem of overfitting.

At step 605H, reformulate the optimization problem to be trained over the augmented training set. In an embodiment, the conditions/intermediate shape concepts can minimize four intermediate losses (each respectively relating to one of the above four specified conditions/intermediate shape concepts) in the reformulated optimization problem.

Figure 9:
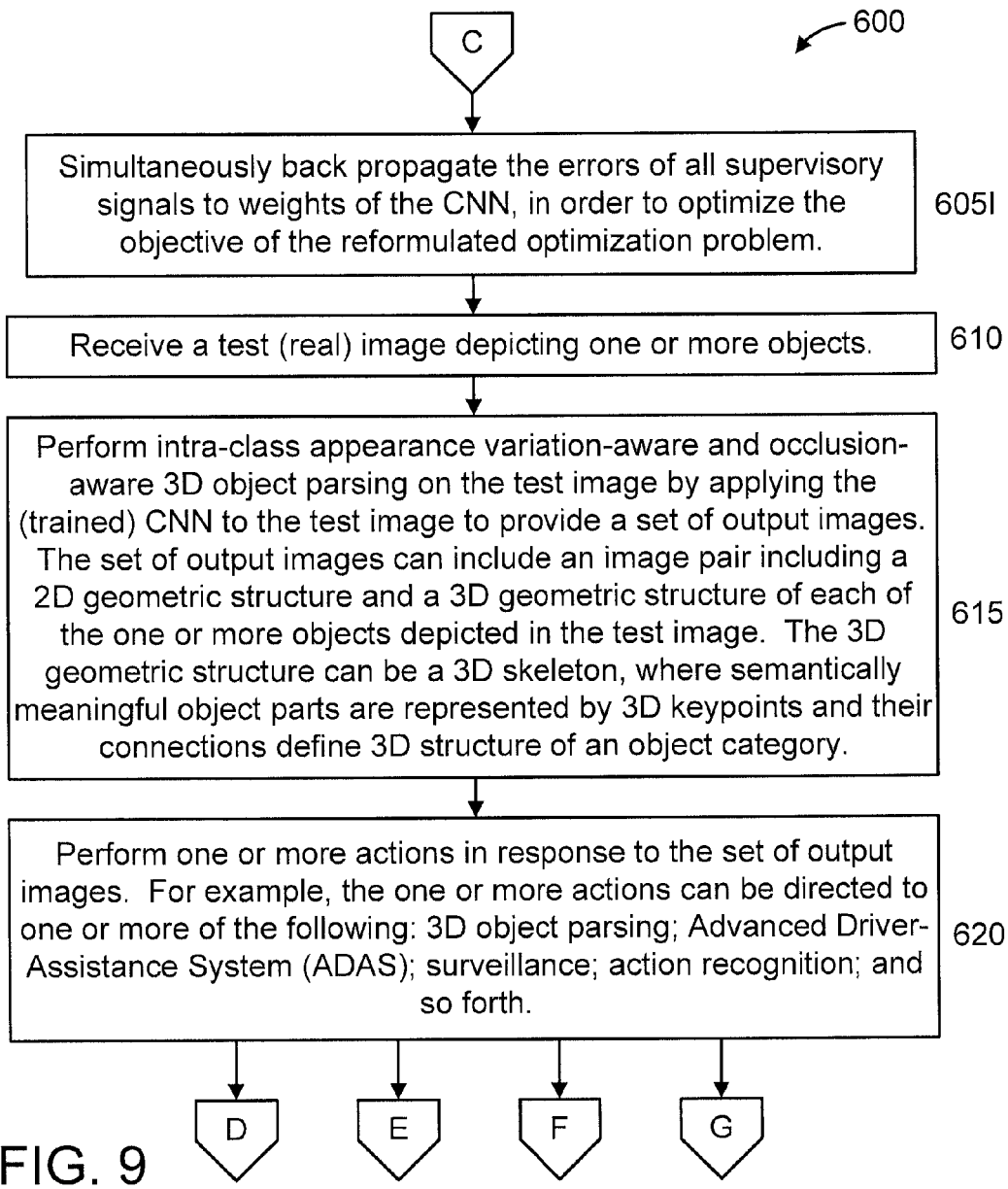

Referring to FIG. 9, at step 605I, simultaneously back propagate the errors of all supervisory signals to weights of the CNN, in order to optimize the objective of the reformulated optimization problem.

At step 610, receive a test (real) image depicting one or more objects.

At step 615, perform intra-class appearance variation-aware and occlusion-aware 3D object parsing on the test image by applying the (trained) CNN to the test image to provide a set of output images. In an embodiment, the set of output images can include an image pair including a 2D geometric structure and a 3D geometric structure of each of the one or more objects depicted in the test image. In an embodiment, the 3D geometric structure can be a 3D skeleton, where semantically meaningful object parts (such as the wheels of a car) are represented by 3D keypoints and their connections define 3D structure of an object category.

At step 620, perform one or more actions in response to the set of output images. For example, the one or more actions can be directed to one or more of the following: 3D object parsing; Advanced Driver-Assistance System (ADAS); surveillance; action recognition; and so forth.

In an embodiment, step 620 can include one or more of steps 620A through 620C.

Figure 10:
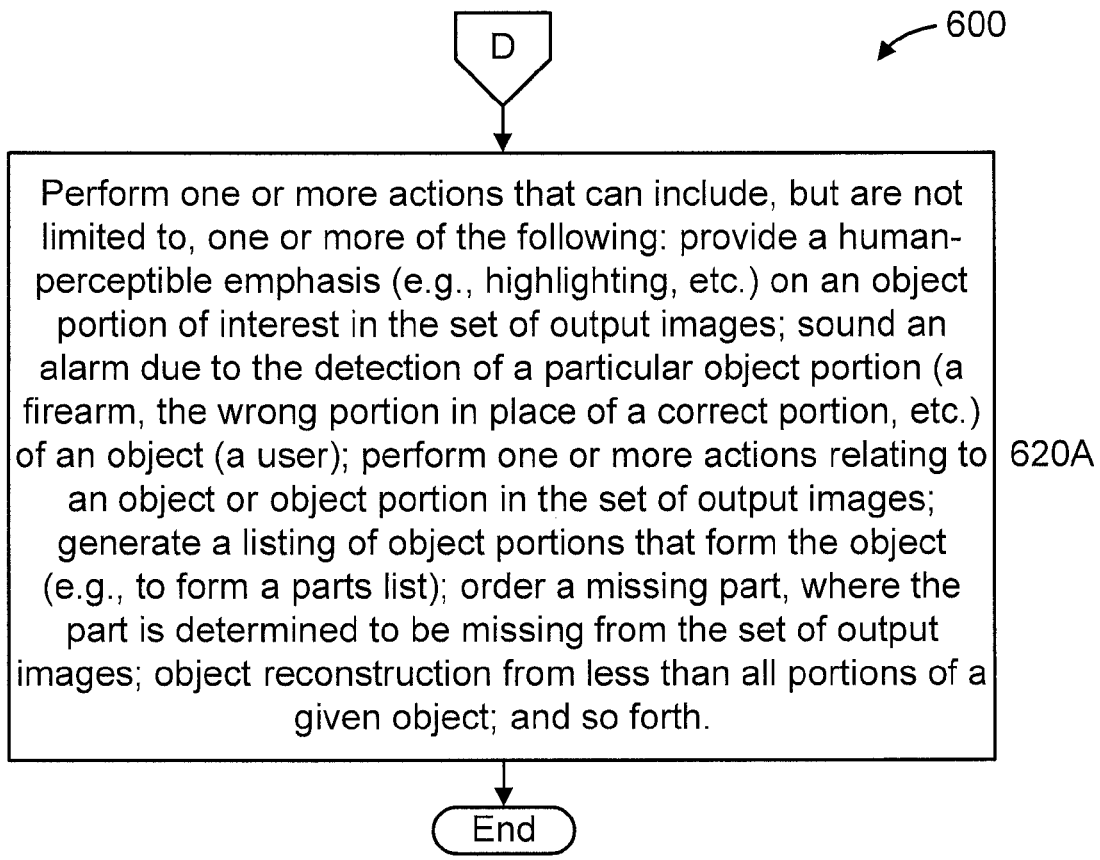

Referring to FIG. 10, at step 620A, corresponding to 3D object parsing, perform one or more actions that can include, but are not limited to, one or more of the following: provide a human-perceptible emphasis (e.g., highlighting, etc.) on an object portion of interest in the set of output images; sound an alarm due to the detection of a particular object portion (a firearm, the wrong portion in place of a correct portion, etc.) of an object (a user); perform one or more actions relating to an object or object portion in the set of output images; generate a listing of object portions that form the object (e.g., to form a parts list); order a missing part, where the part is determined to be missing from the set of output images; object reconstruction from less than all portions of a given object; and so forth.

Other actions relating to an Advanced Driver-Assistance System (ADAS), a surveillance system, and an action recognition system are also described herein below.

Figure 11:
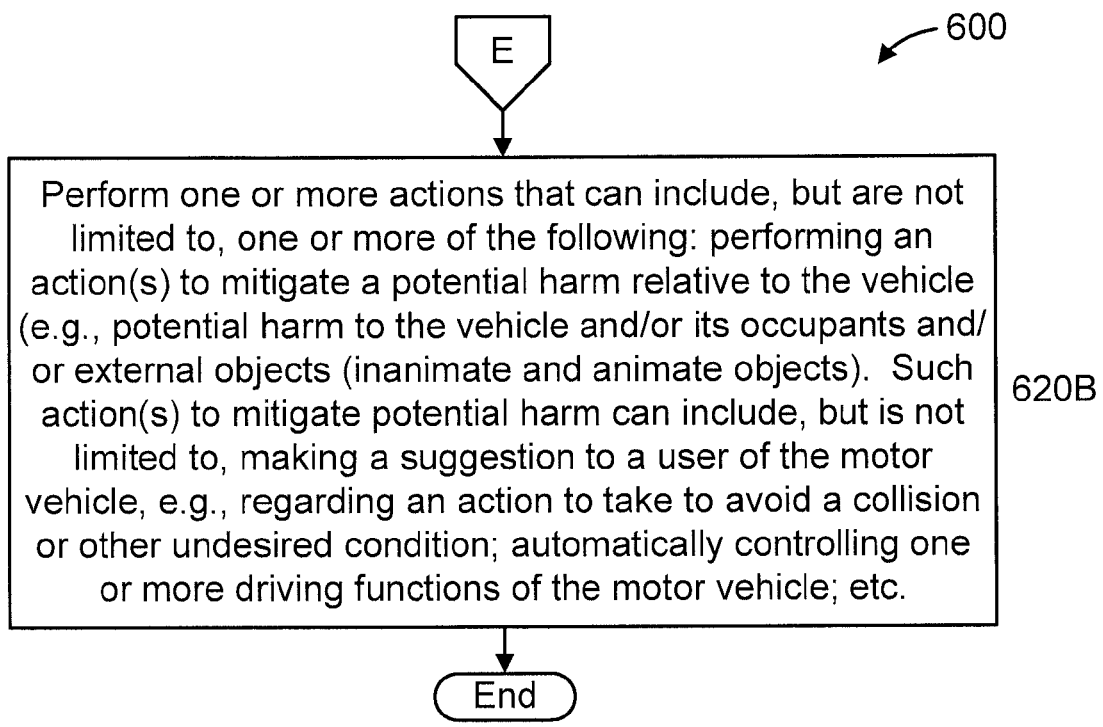

Referring to FIG. 11, at step 620B, corresponding to an Advanced Driver-Assistance System (ADAS), perform one or more actions that can include, but are not limited to, one or more of the following: performing an action(s) to mitigate a potential harm relative to the vehicle (e.g., potential harm to the vehicle and/or its occupants and/or external objects (inanimate and animate objects). Such action(s) to mitigate potential harm can include, but is not limited to, making a suggestion to a user of the motor vehicle, e.g., regarding an action to take to avoid a collision or other undesired condition; automatically controlling one or more driving functions of the motor vehicle; etc.

For example, automatically control one or more driving functions responsive to the detection results. For example, in an embodiment, the present invention is integrated with and/or otherwise coupled to an Advanced Driver-Assistance System (ADAS). The ADAS could apply a decision making process to, e.g., objects and/or object portions depicted in the set of output images, in order to determine whether a dangerous condition(s) exists or not (with respect to the motor vehicle) and to further determine a proper corrective action to take to avoid or at least mitigate any potential harm that can result from the dangerous condition. The decision making process can be any known type of decision making process including, but not limited to, preprogrammed rules, a neural network, a decision tree, and so forth. It is to be appreciated that the preceding decision making processes are merely illustrative and, thus, other decision making processes can also be used in accordance with the teachings of the present invention, while maintaining the spirit of the present invention.

The control that can be imposed by step 620B can involve, for example, but is not limited to, steering, braking, and accelerating functions. For example, responsive the location of an object or object portion directly in the path of the motor vehicle, the processor may initiate a control signal to the braking system to apply the brakes in order to avoid hitting the object or object portion with the motor vehicle. In another embodiment, when safe, the vehicle can be automatically steered by the processor initiating a control signal to the steering system. These and other implementations are readily determined by one of ordinary skill in the art, given the teachings of the present invention provided herein, while maintaining the spirit of the present invention.

Regarding the recommendations to the vehicle operator (e.g., brake now, brake hard, steer right, accelerate, etc.), these recommendations can be made visually and/or audibly. Hence, as can be envisioned by one of ordinary skill in the art, such recommendation can be directed to avoiding objects or object portions in a path of the motor vehicle (such as, e.g., an emergency vehicle or a non-emergency vehicle), where such objects or object portions can be inanimate or animate objects.

Figure 12:
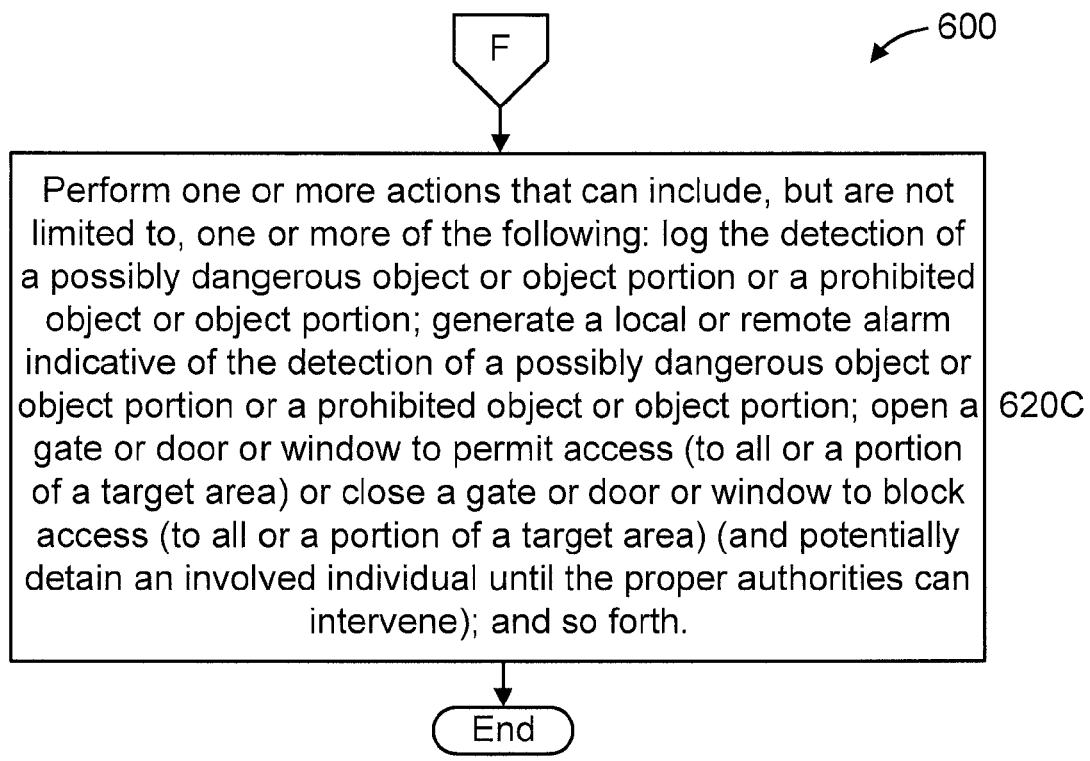

Referring to FIG. 12, at step 620C, corresponding to surveillance, perform one or more actions that can include, but are not limited to, one or more of the following: log the detection of a possibly dangerous object or object portion or a prohibited object or object portion; generate a local or remote alarm indicative of the detection of a possibly dangerous object or object portion or a prohibited object or object portion; open a gate or door or window to permit access (to all or a portion of a target area) or close a gate or door or window to block access (to all or a portion of a target area) (and potentially detain an involved individual until the proper authorities can intervene); and so forth.

Figure 13:
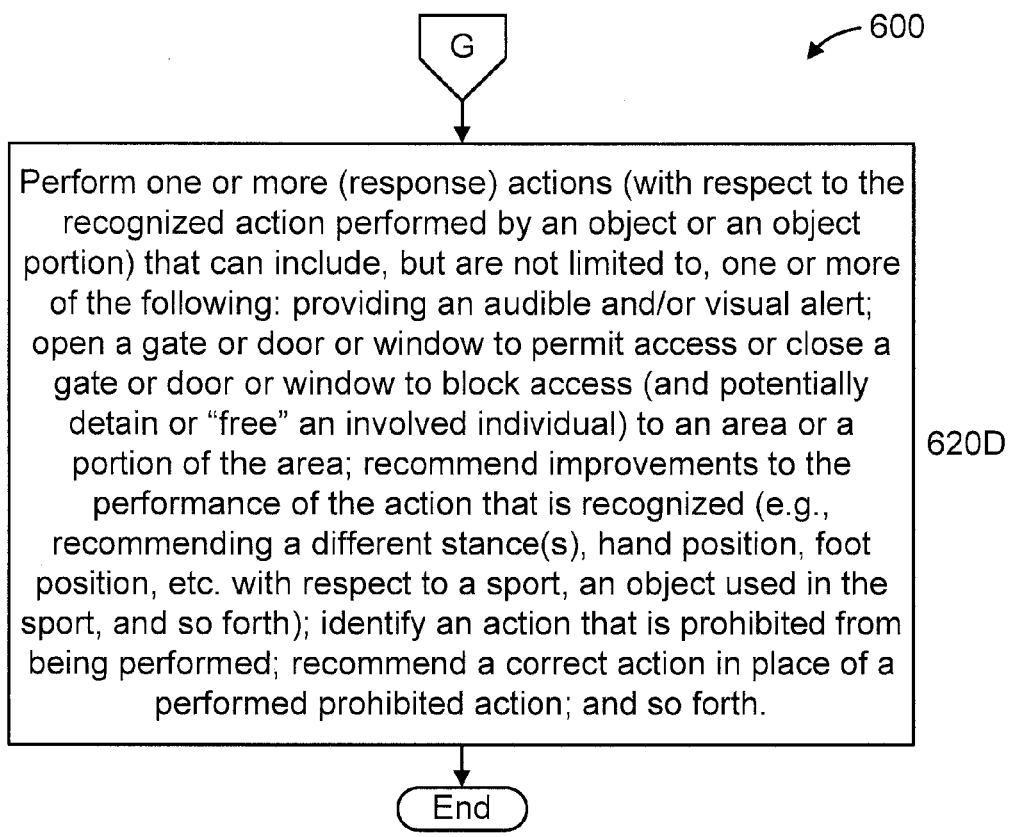

Referring to FIG. 13, at step 620D, corresponding to action recognition, perform one or more (response) actions (with respect to the recognized action performed by an object or an object portion) that can include, but are not limited to, one or more of the following: providing an audible and/or visual alert; open a gate or door or window to permit access or close a gate or door or window to block access (and potentially detain or "free" an involved individual) to an area or a portion of the area; recommend improvements to the performance of the action that is recognized (e.g., recommending a different stance(s), hand position, foot position, etc. with respect to a sport, an object used in the sport, and so forth); identify an action that is incorrect and/or prohibited from being performed; recommend a correct and/or authorized action in place of a performed prohibited action; and so forth.

The system could apply a decision making process to, e.g., a list of object positions determined by step 620A, in order to determine what type of action is being performed (in order to recognize the action) and what type of response action should be performed in response to the detected action type, based on the set of output images. The decision making process can be any known type of decision making process including, but not limited to, preprogrammed rules, a neural network, a decision tree, and so forth. It is to be appreciated that the preceding decision making processes are merely illustrative and, thus, other decision making processes can also be used in accordance with the teachings of the present invention, while maintaining the spirit of the present invention. Hence, the system could determine a person is performing a dangerous action (e.g., waiving a weapon (e.g., a knife, a firearm, etc.) and then secure the person within a target area or a region within a target area. The system could provide a user perceptible recommendation for a corrective action to the action performed by one or more users in order to optimize a performance of an action performed by the one or more users. The action can be a sports or any other type of action.

Regarding step 620 and its "sub-steps", the preceding actions mentioned with respect thereto are merely illustrative and, thus, other actions can also be performed in response to object detection and tracking results. As is evident to one of ordinary skill in the art, the action(s) taken is(are) dependent upon the type of application to which the present invention is applied.

A description will now be given regarding further aspects of the present invention.

Monocular 3D object parsing is highly desirable in various scenarios including occlusion reasoning and holistic scene interpretation. The present invention provides a deep convolutional neural network (CNN) architecture to localize semantic parts in 2D image and 3D space while inferring their visibility states, given a single RGB image. A key insight is to exploit domain knowledge to regularize the network by deeply supervising its hidden layers, in order to sequentially infer intermediate concepts associated with the final task. To acquire training data in desired quantities with ground truth 3D shape and relevant concepts, 3D object CAD models are rendered to generate large-scale synthetic data and simulate challenging occlusion configurations between objects.

Herein, intermediate shape concepts pertinent to 2D/3D shape understanding, such as pose and part visibility, are applied to supervise intermediate layers of a CNN. This allows greater accuracy in localizing the semantic elements of an object observed in a single image.

To illustrate this idea, a 3D skeleton is used as the shape representation, where semantically meaningful object parts (such as the wheels of a car) are represented by 3D keypoints and their connections define 3D structure of an object category. This representation is more efficient than 3D volumes or meshes in conveying the semantic information necessary for shape reasoning in applications such as autonomous driving.

A novel CNN architecture is provided which jointly models multiple shape concepts including object pose, keypoint locations and visibility. A deep supervision framework is formulated by generalizing Deeply Supervised Nets. Herein, one particular network instance is described where convolutional layers at different depths are deeply supervised with intermediate shape concepts. Further, instead of using expensive manual annotations, it is proposed to render 3D CAD models to create synthetic images with intermediate shape concept labels and simulate the challenging occlusion configurations for robust occlusion reasoning.

Figure 14:
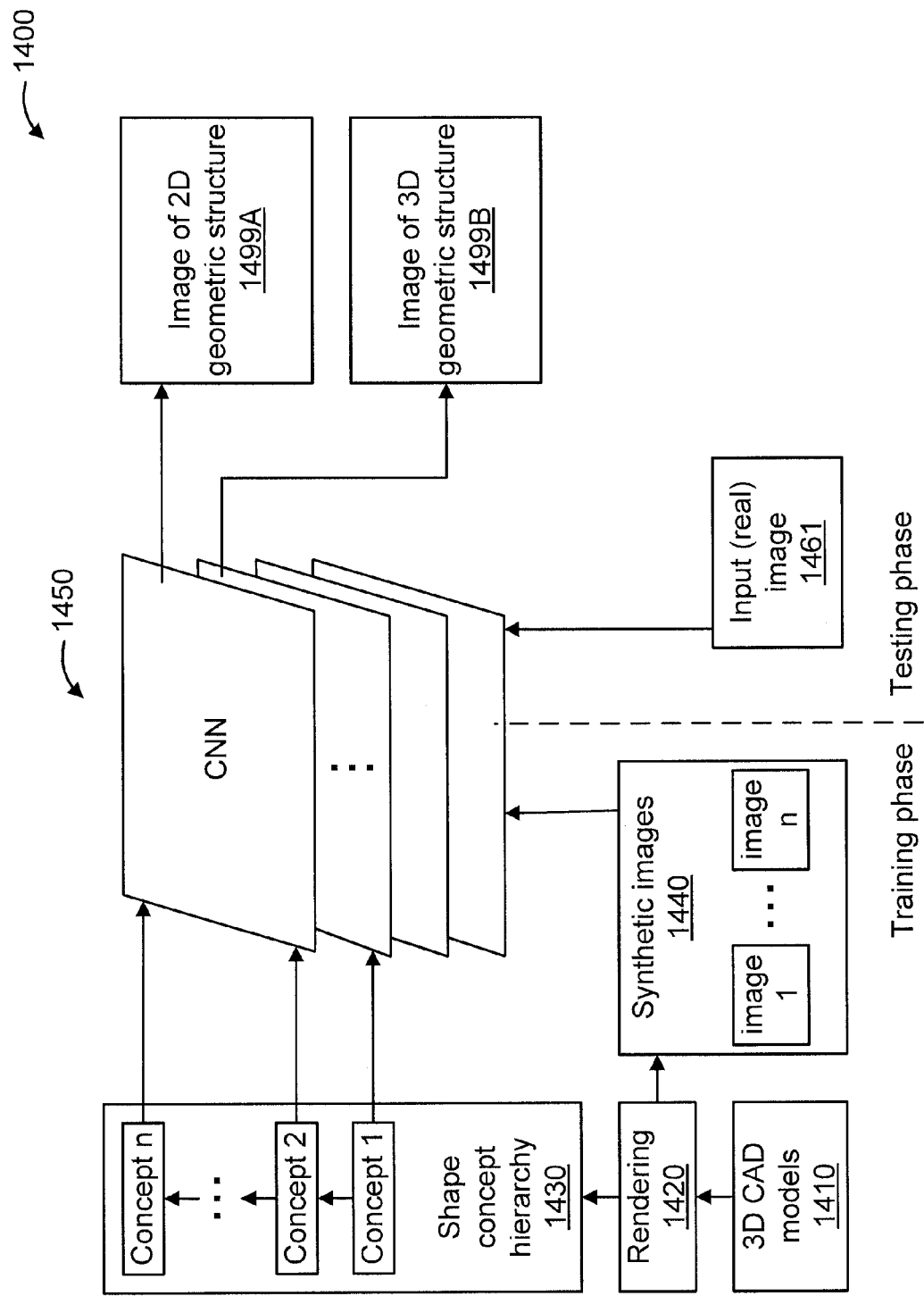
FIG. 14 illustrates an overall framework of the present invention, in accordance with an embodiment of the present invention.

FIG. 14 illustrates an overall framework 1400 of the present invention, in accordance with an embodiment of the present invention. The framework 1400 includes 3D CAD models 1410, a rendering pipeline 1420, a shape concept hierarchy 1430, a set of synthetic images 1440, and a Convolutional Neural Network (CNN) 1450. An input (real) image 1461 is provided to the CNN 1450, which then generates an image 1499A of a 2D geometric structure of an object (or a portion thereof) and/or an image 1499B of a 3D geometric structure of the object (or a portion thereof). Hence, in a test or recognition stage, the present invention provides accurate localization of semantic parts in 2D and/or 3D, while being robust to intra-class appearance variations as well as occlusions.

Figure 15:
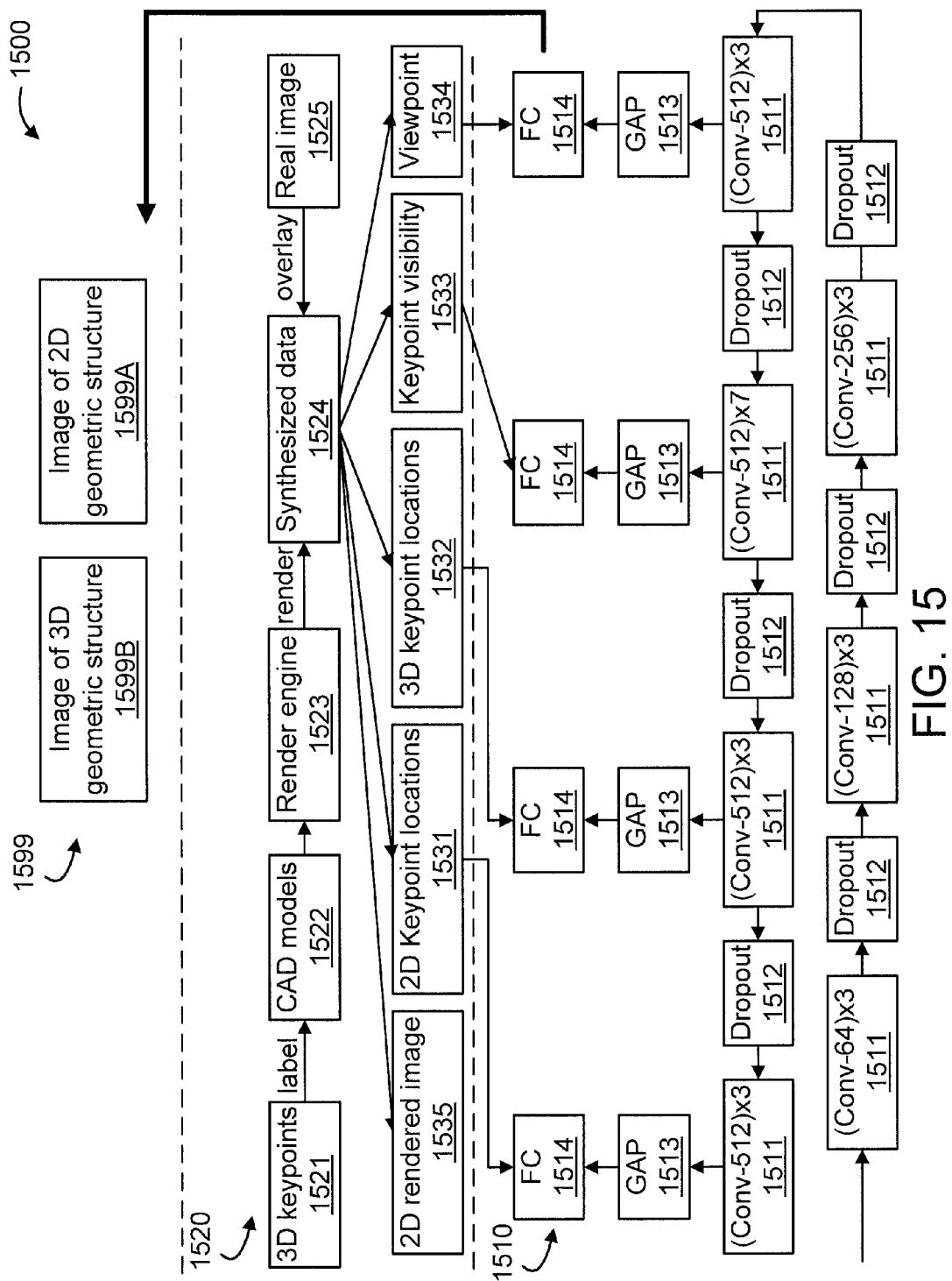
FIG. 15 illustrates an exemplary instance of deeply supervised CNN using shape concepts, in accordance with an embodiment of the present invention.

FIG. 15 illustrates an exemplary instance of deeply supervised CNN 1500 using shape concepts, in accordance with an embodiment of the present invention.

The CNN 1500 includes a learning network 1510, also referred to herein as "DISCO", which stands for Deep supervision with Intermediate Shape COncepts.

The CNN 1500 further includes a rendering pipeline 1520.

The learning network 1510 includes convolutional blocks [(CONV–A)×B] 1511, dropout portions 1512, GAPs 1513, and Fully Connected (FC) layers 1514. In blocks 1511, the "A" and the "B" in "(CONV–A)×B" means A stacked convolutional layers with filters of size B×B.

The rendering pipeline 1520 includes and/or otherwise involves 3D keypoints 1521, CAD models 1522, a render engine 1523, synthesized data 1524, a real image 1525, 2D keypoint locations 1531, 3D keypoint locations 1532, keypoint visibility 1533, viewpoint 1534, and a 2D rendered image 1535.

An output 1599 from the CNN 1500 includes an image of 2D keypoints 1599A and an image of a 3D skeleton structure 1599B.

At test time, DISCO trained on only synthetic images generalizes well to real images. In particular, DISCO empirically outperforms single-task architectures without supervision for intermediate shape concepts and multitask networks which impose supervision of all the concepts at the last layer. This observation demonstrates the intimacy of shape concepts for 3D object parsing, despite the fact that we ignore aspects of photorealism such as material and illumination in our rendered training data.

It is noted that most existing approaches estimate 3D geometry by comparing projections of parameterized shape models with separately predicted 2D patterns, such as keypoint locations or heat maps. This makes prior methods sensitive to partial view ambiguity and incorrect 2D structure predictions. Moreover, scarce 3D annotations for real images further limit their performance. In contrast, the present invention makes the following novel contributions to alleviate those problems:

(1) We demonstrate the utility of rendered data with access to intermediate shape concepts. In addition, we model occlusions by appropriately rendering multiple object configurations, which presents a novel way of exploiting 3D CAD data for realistic scene interpretation.

(2) We apply intermediate shape concepts to deeply supervise the hidden layers of a CNN. This approach exhibits the better generalization from synthetic to real images than the standard end-to-end training.

(3) Our method achieves state-of-the-art performance on 2D/3D semantic part localization under occlusion and large appearance changes on several public benchmarks.

A description will now be given regarding deep supervision with shape concepts, in accordance with an embodiment of the present invention.

Herein, a novel CNN architecture is provided for 3D shape parsing which incorporates constraints through intermediate shape concepts such as object pose, keypoint locations, and visibility information. A goal of the present invention is to infer, from a single view (RGB image) of the object, the locations of keypoints in 2D and 3D spaces and their visibility.

A description will now be given regarding deep supervision, in accordance with an embodiment of the present invention.

In an embodiment, the present invention sequentially applies deep supervision on intermediate concepts intrinsic to the ultimate task, in order to regularize the network for better generalization.

Let $\mathcal{Z} = \{(x, y)\}$ represent the training set with pairs of input x and labels y for a supervised learning task. The associated optimization problem for a multi-layer CNN is as follows:

$$W^* = \min_{W} \sum_{(x,y) \in \mathcal{Z}} l(y, f(x, W)) \qquad (1)$$

where $l(\cdot,\cdot)$ is a problem specific loss, $W=\{W_1, \ldots, W_N\}$ stands for the weights of N layers, and function $f$ is defined based on the network structure. In practice, the optimal solution $\hat{W}^*$ may suffer from overfitting. That is, given a new population of data $\mathcal{Z}'$, the performance of $f(\cdot, W)$ on $\mathcal{Z}'$ is substantially lower than on $\mathcal{Z}$. This is particularly the case when, for example, we train on synthetic data but test on real data.

One way to address the overtraining is through regularization which biases the network to incrementally reproduce physical quantities that are relevant to the final answer. For example, object pose is an indispensable element to predict 3D keypoint locations. Intuitively, the idea is to prefer solutions that reflect the underlying physical structure of the problem which is entangled in the original training set. Since deeper layers in CNNs represent more complex concepts due to growing size of receptive fields and more non-linear transformations stacked along the way, we may realize our intuition by explicitly enforcing that hidden layers yield a sequence of known intermediate concepts with growing complexity towards the final task.

To this end, we define the augmented training set $\mathcal{A} = \{(x, \{y_1, \ldots, y_N\})\}$ with additional supervisory signals $\{y_1, \ldots, y_{N-1}\}$. Further, we denote $W_{1:i}=\{W_1, \ldots, W_i\}$ as the weights for the first i layers of the CNN and $h_i=f(\cdot, W_{1:i})$ as the activation map of layer i. We now extend (1) to the additional training signals $y_i$ by introducing functions $y_i=g(h_i, v_i)$ parameterized by the weight $v_i$. Letting $V=\{v_1, \ldots, v_{N-1}\}$, we can now write a new objective trained over $\mathcal{Z}$:

$$\hat{W}^*, \hat{V}^* = \underset{W,V}{\operatorname{argmin}} \sum_{(x,\{y_i\}) \in \mathcal{A}} \sum_{i=1}^{N} \lambda_i l_i(y_i, g(f(x, W_{1:i}), v_i)) \qquad (2)$$

The above objective can be optimized by simultaneously back propagating the errors of all supervisory signals scaled by $\lambda_i$ on each $l_i$ to $W_{1:i}$. From the perspective of the original problem, new constraints through $y_i$ act as additional regularization on the hidden layers, thus biasing the network toward solutions that exhibit better generalization than solutions to Equation (1).

A description will now be given regarding network architecture, in accordance with an embodiment of the present invention.

To set up Equation (2), we must first choose a sequence of necessary conditions for 2D/3D keypoint prediction with growing complexity as intermediate shape concepts. We have chosen, in order, (1) object viewpoint, (2) keypoint visibility, (3) 3D keypoint locations and (4) full set of 2D keypoint locations regardless of the visibility. We impose this sequence of intermediate concepts to deeply supervise the network at certain depths and minimize four intermediate losses $l_i$ in Equation (2), with other losses removed.

Our network resembles a VGG neural network and includes deeply stacked 3×3 convolutional layers. However, unlike VGG, we remove local spatial pooling and couple each convolutional layer with batch normalization and ReLU, which defines the $f(x, W_{1:i})$ in Equation (2). This is motivated by the intuition that spatial pooling leads to the loss of spatial information. Further, $g(h_i, v_i)$ is constructed with one global average pooling (GAP) layer followed by one fully connected (FC) layer with 512 neurons, which is different from stacked FC layers in VGG. These two changes are critical to significantly improve the performance of VGG like networks for 2D/3D landmark localization.

To further reduce the issue of overfitting, we deploy dropout between the hidden convolutional layers. At layers 4, 8, 12, we perform the down sampling using convolution layers with stride 2. FIG. 15 (bottom-left) illustrates our network architecture in detail. We use L2 loss at all points of supervision. "(Conv–A)×B" means A stacked convolutional layers with filters of size B×B. We deploy 25 convolutional layers in total.

In experiments, we only consider the azimuth angle of the object viewpoint with respect to a canonical pose. We further discretize the azimuth angle into M bins and regress it to a one-hot encoding (the entry corresponding to the predicted discretized pose is set to 1 and all others to 0). Keypoint visibility is also represented by a binary vector with 1 indicating occluded state of a keypoint. 2D keypoint locations are normalized to [0, 1] with the image size along the width and height dimensions. We center 3D keypoint coordinates of a CAD model at the origin and scale them to set the longest dimension (along X,Y,Z) to unit length. CAD models are assumed to be aligned along the principal coordinate axes, and registered to a canonical pose, as is the case for the ShapeNet dataset. During training, each loss is back propagated to train the network jointly.

A description will now be given regarding synthetic data generation, in accordance with an embodiment of the present invention.

Our approach can use a large amount of training data because it is based on deep CNNs and involves more fine-grained labels than other visual tasks such as object classification. Furthermore, we aim for the method to work with occluded test cases. Therefore, we need to generate training examples that are representative of realistic occlusion configurations caused by multiple objects in close proximity as well as image boundary truncations. To obtain such large-scale training data, we extend the data generation pipeline of "Render for CNN" with 2D/3D landmarks and visibility information.

In the rendering process, we pick a small subset of CAD models from ShapeNet for a given object category and manually annotate 3D keypoints on each CAD model. Next, we render each CAD model using the open-source tool Blender while randomly sampling rendering parameters from a uniform distribution including camera viewpoint, number/strength of light sources, and surface gloss reflection. Finally, we overlay the rendered images on real image backgrounds to avoid overfitting to synthetic data. We crop the object from each rendered image and extract the object viewpoint, 2D/3D keypoint locations and their visibility states from the render engine as the training labels.

To model multi-object occlusion, we randomly select two different object instances and place them close to each other without overlapping in 3D space. During rendering, we compute the occlusion ratio of each instance by calculating the fraction of visible 2D area versus the complete 2D projection of CAD model. Keypoint visibility is computed by ray-tracing. We select instances with occlusion ratios ranging from 0.4 to 0.9. For truncation, we randomly select two image boundaries (left, right, top, or bottom) of the object and shift them by [0, 0.3] of the image size along that dimension.

Embodiments described herein may be entirely hardware, entirely software or including both hardware and software elements. In a preferred embodiment, the present invention is implemented in software, which includes but is not limited to firmware, resident software, microcode, etc.

Embodiments may include a computer program product accessible from a computer-usable or computer-readable medium providing program code for use by or in connection with a computer or any instruction execution system. A computer-usable or computer readable medium may include any apparatus that stores, communicates, propagates, or transports the program for use by or in connection with the instruction execution system, apparatus, or device. The medium can be magnetic, optical, electronic, electromagnetic, infrared, or semiconductor system (or apparatus or device) or a propagation medium. The medium may include a computer-readable medium such as a semiconductor or solid state memory, magnetic tape, a removable computer diskette, a random access memory (RAM), a read-only memory (ROM), a rigid magnetic disk and an optical disk, etc.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This may be extended, as readily apparent by one of ordinary skill in this and related arts, for as many items listed.

Having described preferred embodiments of a system and method (which are intended to be illustrative and not limiting), it is noted that modifications and variations can be made by persons skilled in the art in light of the above teachings. It is therefore to be understood that changes may be made in the particular embodiments disclosed which are within the scope and spirit of the invention as outlined by the appended claims. Having thus described aspects of the invention, with the details and particularity required by the patent laws, what is claimed and desired protected by Letters Patent is set forth in the appended claims.

What is claimed is:

1. A system for driving assistance, comprising:
    an image capture device configured to capture an actual image relative to an outward view from a motor vehicle and depicting an object;
    a hardware processor, configured to
        render, based on a set of 3D Computer Aided Design (CAD) models, a set of synthetic images with corresponding intermediate shape concept labels;
        form a multi-layer Convolutional Neural Network (CNN) which jointly models multiple intermediate shape concepts, based on the rendered synthetic images;
        perform an intra-class appearance variation-aware and occlusion-aware 3D object parsing on the actual image by applying the CNN to the actual image to output an image pair including a 2D geometric structure and a 3D geometric structure of the object depicted in the actual image; and
        control the motor vehicle to mitigate a likelihood of potential harm involving the motor vehicle, based on the image pair.

2. The system of claim 1, wherein at least some of the rendered synthetic images represent various occlusion scenarios for the at least some of the objects to be modeled.

3. The system of claim 1, wherein the multiple intermediate shape concepts comprise a concept selected from the group consisting of (i) object pose, (ii) object viewpoint, (iii) keypoint locations, and (iv) keypoint visibility.

4. The system of claim 1, wherein the multiple intermediate shape concepts form a shape concept hierarchy for governing supervision of the CNN.

5. The system of claim 1, wherein the multiple intermediate shape concepts are used to supervise the CNN at different depths and minimize certain intermediate losses.

6. The system of claim 1, wherein, for a given object to be modeled, the rendered synthetic images comprise at least one rendered synthetic image of the given object with corresponding 2D keypoints of the given object and at least one rendered synthetic image of a 3D skeleton structure of the given object.

7. The system of claim 1, wherein the rendered synthetic images are augmented with 2D and 3D landmarks and visibility information.

8. The system of claim 1, wherein at least some of the rendered synthetic images comprise a respective rendered synthetic image based on synthetic data which is overlayed onto a respective real image background to mitigate overfitting to the synthetic data.

9. The system of claim 1, wherein the processor is further configured to post-process the rendered synthetic images by:
    cropping a synthetic object from the rendered synthetic images; and
    extracting an object viewpoint, 2D and 3D keypoint locations and corresponding visibility states of the 2D and 3D keypoint locations as the intermediate shape concept labels used as training labels to provide the rendered synthetic images to the CNN in a form of pairs of input x and labels y for a supervised learning task to which the CNN can be applied.

10. The system of claim 1, wherein the processor is further configured to train the CNN for a supervised learning task by augmenting the rendered synthetic images used to train the CNN with supervisory signals to form an augmented training set.

11. The system of claim 10, wherein the processor is further configured to explicitly enforce a condition that hidden layers of the CNN yield a sequence of known intermediate concepts with growing complexity towards a final task to provide data regularization, using the augmented training set.

12. The system of claim 10, wherein the processor is further configured to train the CNN over the augmented training set using an optimization problem that considers the multiple intermediate shape concepts in order to minimize intermediate losses relating to the multiple intermediate shape concepts.

13. The system of claim 12, wherein the processor is further configured to simultaneously back propagate errors of the supervisory signals to optimize an objective of the optimization problem.

14. The system of claim 1, wherein the CNN is formed to include a Global Average Pooling layer followed by a Fully Connected layer.

15. The system of claim 1, wherein the 3D geometric structure of the object comprises a 3D skeleton of the object having semantically meaningful object parts represented by 3D keypoints and connections of the object parts defining the 3D structure of an object category corresponding to the object.

16. The system of claim 1, wherein the system is comprised in an advanced driver-assistance system that uses a decision making process to evaluate a scene depicted in the actual image as potentially dangerous such that the processor provides a user-perceptible indication to indicate that the scene is potentially dangerous.

17. The system of claim 1, wherein the system is comprised in an advanced driver-assistance system that uses a decision making process to evaluate a scene depicted in the actual image as potentially dangerous such that the processor automatically takes control over one or more systems of the motor vehicle to mitigate the potential harm.

18. The system of claim 17, wherein the one or more systems of the motor vehicle are selected from the group consisting of a steering system, a braking system, and an acceleration system.

19. A method for driving assistance, comprising:
   capturing, by an image capture device, an actual image relative to an outward view from a motor vehicle and depicting an object;
   rendering, by a hardware processor based on a set of 3D Computer Aided Design (CAD) models, a set of synthetic images with corresponding intermediate shape concept labels;
   forming, by the hardware processor, a multi-layer Convolutional Neural Network (CNN) which jointly models multiple intermediate shape concepts, based on the rendered synthetic images;
   performing, by the hardware processor, an intra-class appearance variation-aware and occlusion-aware 3D object parsing on the actual image by applying the CNN to the actual image to output an image pair including a 2D geometric structure and a 3D geometric structure of the object depicted in the actual image; and
   controlling, by the hardware processor, the motor vehicle to mitigate a likelihood of potential harm involving the motor vehicle, based on the image pair.

20. A computer program product for driving assistance, the computer program product comprising a non-transitory computer readable storage medium having program instructions embodied therewith, the program instructions executable by a computer to cause the computer to perform a method, comprising:
   capturing, by an image capture device, an actual image relative to an outward view from a motor vehicle and depicting an object;
   rendering, by a hardware processor based on a set of 3D Computer Aided Design (CAD) models, a set of synthetic images with corresponding intermediate shape concept labels;
   forming, by the hardware processor, a multi-layer Convolutional Neural Network (CNN) which jointly models multiple intermediate shape concepts, based on the rendered synthetic images;
   performing, by the hardware processor, an intra-class appearance variation-aware and occlusion-aware 3D object parsing on the actual image by applying the CNN to the actual image to output an image pair including a 2D geometric structure and a 3D geometric structure of the object depicted in the actual image; and
   controlling the motor vehicle to mitigate a likelihood of potential harm involving the motor vehicle, based on the image pair.

* * * * *